(12) United States Patent
Perreault et al.

(10) Patent No.: US 12,712,428 B2
(45) Date of Patent: Aug. 18, 2026

(54) CONTROLLABLE TRANSFORMATION NETWORKS FOR RADIO FREQUENCY POWER CONVERSION

(71) Applicant: Massachusetts Institute of Technology, Cambridge, MA (US)

(72) Inventors: David J. Perreault, Cambridge, MA (US); Khandoker N. Rafa Islam, Cambridge, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 140 days.

(21) Appl. No.: 18/714,328

(22) PCT Filed: Dec. 15, 2022

(86) PCT No.: PCT/US2022/052962

§ 371 (c)(1),
(2) Date: May 29, 2024

(87) PCT Pub. No.: WO2023/114367

PCT Pub. Date: Jun. 22, 2023

(65) Prior Publication Data

US 2025/0023446 A1 Jan. 16, 2025

Related U.S. Application Data

(60) Provisional application No. 63/289,809, filed on Dec. 15, 2021.

(51) Int. Cl.
*H02M 1/00* (2007.01)
*H02M 1/08* (2006.01)
(Continued)

(52) U.S. Cl.
CPC .......... *H02M 1/0058* (2021.05); *H02M 1/08* (2013.01); *H02M 5/293* (2013.01);
(Continued)

(58) Field of Classification Search
CPC ...... H03F 2200/451; H03F 3/245; H03F 3/19; H03F 2200/387; H03F 3/211; H03F 3/24;
(Continued)

(56) References Cited

U.S. PATENT DOCUMENTS

| | | |
|---|---|---|
| 3,800,167 A | 3/1974 | Smith |
| 5,195,045 A | 3/1993 | Keane et al. |

(Continued)

FOREIGN PATENT DOCUMENTS

| | | |
|---|---|---|
| CN | 103181086 A | 6/2013 |
| EP | 0 786 863 A2 | 7/1997 |

(Continued)

OTHER PUBLICATIONS

Jurkov et al.,"Tunable Matching Networks Based on Phase-Switched Impedance Modulation", IEEE Transactions on Power Electronics, Institute of Electrical and Electronics Engineers, USA, vol. 35, No. 10, Mar. 12, 2020, pp. 10150-10167 (Year: 2020).*

(Continued)

*Primary Examiner* — Andrea Lindgren Baltzell
*Assistant Examiner* — Tyler J Pereny
(74) *Attorney, Agent, or Firm* — Daly, Crowley, Mofford & Durkee, LLP

(57) ABSTRACT

In one aspect, a system for transforming a radio frequency (RF) signal between a source and a load can include: a first port and a second port connected to different ones of the source and the load; a first filter connected to the first port; a second filter connected to the second port, at least one of the first and second filters operable to provide variable reactance using dynamic frequency tuning (DFT); a two-port switching network connected between the first filter and the second filter, the switching network comprising a plurality of switches; and a controller coupled to the switching network and to the source, the controller configured to (Continued)

operate the plurality of switches according to a switching pattern and to dynamically adjust a frequency of the RF signal to provide controllable impedance matching between the first port and the second port.

19 Claims, 18 Drawing Sheets

(51) Int. Cl.
*H02M 5/293* (2006.01)
*H02M 7/5387* (2007.01)
*H03F 1/56* (2006.01)

(52) U.S. Cl.
CPC .......... *H02M 7/5387* (2013.01); *H03F 1/565* (2013.01); *H03F 2200/387* (2013.01)

(58) Field of Classification Search
CPC . H03F 1/56; H03F 1/02; H03F 1/0205; H03F 1/565; H03F 3/21; H03F 3/2176; H03F 1/0227; H03F 2200/391; H03F 3/193; H03F 3/2171; H03F 3/2178; H03F 2200/301; H03F 2200/504; H03F 2200/511; H03F 2203/21106; H03F 3/195; H03F 1/0211; H03F 3/602; H03H 7/40; H03H 7/38; H03H 11/28; H01J 37/32183; H01J 37/32082; H02M 7/217; H02M 3/158; H02M 1/0058; H02M 1/009; H02M 3/01; H02M 3/07; H02M 3/33569; H02M 1/0074; H02M 1/0085
See application file for complete search history.

(56) References Cited

U.S. PATENT DOCUMENTS

| | | | |
|---|---|---|---|
| 6,239,996 B1 | 5/2001 | Perreault et al. | |
| 6,346,797 B1 | 2/2002 | Perreault et al. | |
| 6,456,514 B1 | 9/2002 | Perreault et al. | |
| 6,587,017 B1 | 7/2003 | Sheng et al. | |
| 6,671,195 B2 | 12/2003 | Perreault et al. | |
| 6,887,339 B1 | 5/2005 | Goodman et al. | |
| 6,900,997 B2 | 5/2005 | Perreault et al. | |
| 6,937,115 B2 | 8/2005 | Perreault et al. | |
| 7,302,237 B2 | 11/2007 | Jackson et al. | |
| 8,054,892 B2 | 11/2011 | Aziz et al. | |
| 8,174,233 B2 | 5/2012 | Julstrom et al. | |
| 8,279,950 B2 | 10/2012 | Aziz et al. | |
| 8,339,174 B2 | 12/2012 | Yang et al. | |
| 8,404,598 B2 | 3/2013 | Liao et al. | |
| 8,525,609 B1 | 9/2013 | Sadasivam et al. | |
| 8,633,782 B2 | 1/2014 | Nagarkatti et al. | |
| 8,718,188 B2 | 5/2014 | Balteanu et al. | |
| 8,830,709 B2 | 9/2014 | Perreault | |
| 8,830,710 B2 | 9/2014 | Perreault et al. | |
| 8,890,618 B2 | 11/2014 | Pamarti et al. | |
| 9,141,832 B2 | 9/2015 | Perreault et al. | |
| 9,374,020 B2 | 6/2016 | Perreault et al. | |
| 9,401,664 B2 | 7/2016 | Perreault et al. | |
| 9,407,164 B2 | 8/2016 | Chang et al. | |
| 9,490,752 B2 | 11/2016 | Briffa et al. | |
| 9,537,456 B2 | 1/2017 | Briffa et al. | |
| 9,634,577 B2 | 4/2017 | Perreault et al. | |
| 9,660,520 B2 | 5/2017 | Perreault et al. | |
| 9,755,576 B2 * | 9/2017 | Perreault | H03F 3/19 |
| 9,755,672 B2 | 9/2017 | Perreault et al. | |
| 9,762,145 B2 | 9/2017 | Perreault et al. | |
| 9,768,731 B2 | 9/2017 | Perreault et al. | |
| 9,768,732 B2 | 9/2017 | Briffa et al. | |
| 9,819,272 B2 | 11/2017 | Perreault et al. | |
| 9,825,545 B2 | 11/2017 | Chen et al. | |
| 9,853,550 B2 | 12/2017 | Perreault et al. | |
| 9,912,303 B2 | 3/2018 | Barton et al. | |
| 9,923,518 B2 | 3/2018 | Perreault et al. | |
| 10,038,461 B2 | 7/2018 | Briffa et al. | |
| 10,075,064 B2 | 9/2018 | Perreault et al. | |
| 10,536,093 B2 | 1/2020 | Perreault | |
| 10,790,784 B2 | 9/2020 | Jurkov et al. | |
| 11,316,477 B2 | 4/2022 | Jurkov et al. | |
| 11,757,416 B2 * | 9/2023 | Chen | H03F 1/56 330/51 |
| 11,942,898 B2 | 3/2024 | Jurkov et al. | |
| 2005/0286278 A1 | 12/2005 | Perreault et al. | |
| 2006/0246848 A1 | 11/2006 | Womac | |
| 2007/0090874 A1 | 4/2007 | Sorrells et al. | |
| 2007/0285140 A1 | 12/2007 | Kubo | |
| 2008/0218291 A1 | 9/2008 | Zhu et al. | |
| 2009/0276639 A1 | 11/2009 | Saha et al. | |
| 2012/0056689 A1 | 3/2012 | Spears et al. | |
| 2013/0033118 A1 | 2/2013 | Karalis et al. | |
| 2013/0187712 A1 * | 7/2013 | Cabanillas | H03F 1/565 330/192 |
| 2013/0285741 A1 | 10/2013 | Wright | |
| 2014/0226378 A1 | 8/2014 | Perreault et al. | |
| 2014/0266433 A1 | 9/2014 | Nobbe et al. | |
| 2014/0355322 A1 | 12/2014 | Perreault et al. | |
| 2015/0023063 A1 | 1/2015 | Perreault et al. | |
| 2015/0084701 A1 | 3/2015 | Perreault et al. | |
| 2015/0188448 A1 | 7/2015 | Perreault et al. | |
| 2016/0173032 A1 | 6/2016 | Kuttner | |
| 2018/0102644 A1 | 4/2018 | Perreault et al. | |
| 2019/0020313 A1 | 1/2019 | Perreault et al. | |
| 2022/0037123 A1 | 2/2022 | Zhang et al. | |
| 2023/0246607 A1 | 8/2023 | Zhang et al. | |

FOREIGN PATENT DOCUMENTS

| | | |
|---|---|---|
| EP | 0 821 304 B1 | 1/1998 |
| EP | 2 582 039 A2 | 4/2013 |
| JP | H 104335 | 1/1998 |
| JP | 2002-158556 | 5/2002 |
| JP | 2002-271160 | 9/2002 |
| JP | 2007-501600 | 1/2007 |
| JP | 2014-187678 | 10/2014 |
| WO | WO 2004/105208 A1 | 12/2004 |
| WO | WO 2007/053569 | 5/2007 |
| WO | WO 2012/099774 | 7/2012 |
| WO | WO 2018/005795 A1 | 1/2018 |
| WO | WO 2022/026797 | 2/2022 |

OTHER PUBLICATIONS

Bastami et al., "A 1.5kW Radio-frequency Tunable Matching Network Based on Phase-Switched Impedance Modulation", IEEE Open Journal of Power Electronics, IEEE, vol. 1, Apr. 16, 2020, pp. 124-138 (Year: 2020).*

Communication Pursuant to Rules 161(2) and 162 EPC dated Jul. 23, 2024, for European Patent Application No. 22908424.9; 3 pages.

Response to Communication Pursuant to Rules 161(2) and 162 EPC dated Jul. 23, 2024, for European Patent Application No. 22908424.9; Response filed Jan. 14, 2025; 6 pages.

U.S. Appl. No. 18/667,152, filed May 17, 2024, Zhang et al.

U.S. Appl. No. 18/443,682, filed Feb. 16, 2024, Jurkov et al.

U.S. Appl. No. 13/722,659, filed Dec. 20, 2012, Perreault, et al.

U.S. Appl. No. 15/797,491, filed Oct. 30, 2017, Perreault, et al.

International Search Report and Written Opinion dated Jul. 19, 2023, for International Patent Application No. PCT/US2022/052962; 11 pages.

Al Bastami et al., "A 1.5kW Radio-Frequency Tunable Matching Network Based on Phase-Switched Impedance Modulation"; IEEE Open Journal of Power Electronics, vol. 1; Apr. 2020; 15 pages.

Wai Po et al., "A Novel Method for Synthesizing an Automatic Matching Network and Its Control Unit"; IEEE Transactions on Circuits and Systems—I: Regular Papers, vol. 58, No. 9; Sep. 2011; 12 pages.

Jurkov et al., "Tunable Matching Networks Based on Phase-Switched Impedance Modulation"; IEEE Transactions on Power Electronics, vol. 35, No. 10; Oct. 2020; 18 pages.

(56) References Cited

OTHER PUBLICATIONS

T. Nesimoglu, et al., "A frequency tunable broadband amplifier utilizing tunable capacitors and inductors," *2013 Conference on Microwave Techniques*, pp. 65-68, Apr. 2013 (4 pages).
Y. Sun, J. Moritz, and X. Zhu, "Adaptive impedance matching and antenna tuning for green software-defined and cognitive radio," *2011 IEEE 54th International Midwest Symposium on Circuits and Systems* (*MWSCAS*), pp. 1-4, Aug. 2011. (4 pages).
Y. Lim, et al., "An adaptive impedance-matching network based on a novel capacitor matrix for wireless power transfer," *IEEE Transactions on Power Electronics*, vol. 29, No. 8, pp. 4403-4413, Aug. 2014. (11 pages).
G. J. J. Winands, et al., "Matching a pulsed power modulator to a corona plasma reactor," *2007 IEEE International Pulsed Power Conference*, pp. 587-590, Jun. 2007. (4 pages).
Nemati, et. al., "Design of Varactor-based tunable matching networks for dynamic load modulation of high power amplifiers," *IEEE Transactions on Microwave Theory and Techniques*, vol. 57, No. 5, pp. 1110-1118, May 2009. (9 pages).
W. C. E. Neo, et al., "Adaptive multi-band multi-mode power amplifier using integrated Varactor-based tunable matching networks," *IEEE Journal of Solid-State Circuits*, vol. 41, No. 9, pp. 2166-2176, Sep. 2006. (11 pages).
Q. Shen and N. S. Barker, "Distributed MEMS tunable matching network using minimal-contact RF-MEMS varactors," *IEEE Transactions on Microwave Theory and Technology*, vol. 54, No. 6, pp. 2646-2658, Jun. 2006. (13 pages).
A. van Bezooijen, et. al., "A GSM/Edge/WCDMA adaptive series-LC matching network using RF-MEMS switches," *IEEE Journal of Soli-State Circuits*, vol. 43, No. 10, pp. 2259-2268, Oct. 2008. (10 pages).
C. Sanchez-Perez, et. al., "Design and applications of a 300-800 MHz tunable matching network," *IEEE Journal on Emerging and Selected Topics in Circuits and Systems*, vol. 3, No. 4, Dec. 2013 (10 pages).
P. Sjoblom and H. Sjoland, "Measured CMOS switched high-quality capacitors in a reconfigurable matching network," *IEEE Transactions on Circuits and Systems II*, vol. 54, No. 10, pp. 858-862, Oct. 2007 (5 pages).
R. Malmqvist, et. al., "RF MEMS based impedance matching networks for tunable multi-band microwave low noise amplifiers," in *Proc. 2009 International Semiconductor Conference*, vol. I, pp. 303-306. (4 pages).
J. Mitola, "The software radio architecture," *IEEE Communications Magazine*, vol. 33, No. 5, pp. 26-38, May 1995. (13 pages).
E. Din, et. al., "Efficiency enhancement of class-F GaN power amplifiers using load modulation," *2010 German Microwave Conference*, pp. 114-117, Mar. 15-17, 2010. (4 pages).
M. Schmidt, et. al., "A comparison of tunable ferroelectric II- and T-matching networks," in *Proc. 37th European Microwave Conference*, pp. 98-101 , Oct. 9-12, 2007. (4 pages).
W. Gu, and K. Harada, "A new method to regulate resonant converters," *IEEE Transactions on Power Electronics*, vol. 3, No. 4, Oct. 1988 (10 pages).
A. Jurkov, L. Roslaniec, and D. Perreault, "Lossless multiway power combining and outphasing for high-frequency resonant inverters," *IEEE Transactions on Power Electronics*, vol. 29, No. 4, pp. 1894-1908, Apr. 2014. (15 pages).
L. Roslaniec, et. al., "Design of single-switch inverters for variable resistance/load modulation operation," *IEEE Transactions on Power Electronics*, accepted for publication (15 pages).
E. Waffenschmidt, "Dynamic Resonant Matching Method for a Wireless Power Transmission Receiver", *IEEE Transactions on Power Electronics*, vol. 30, No. 11. Nov. 2015 (8 pages).
Denieport; "Medical Power Generator Using a Voltage Mode Resonant Converter Controlled by a Synchronous Switched Capacitor is MRI Compatible"; 2014 21$^{st}$ IEEE International Conference on Electronics, Circuits and Systems (ICECS); Dec. 7-10, 2014; 4 Pages.
Extended European Search Report including the Supplementary European Search Report and Search Opinion dated Nov. 21, 2025, for European Patent Application No. 22908424.9; 11 pages.

* cited by examiner 400
412
$V_S$
402
404
414
414
$i_S$
$Z_S$
$i_1$
$Z_1$
$V_1$
$S_W$
$S_Y$
$S_X$
$S_Z$
406w
406y
406x
406z
406
416
$i_2$
$V_2$
408
$Z_2$
$Z_L$
410
$V_L$
$i_L$
$Z_L$
413

CONTROLLABLE TRANSFORMATION NETWORKS FOR RADIO FREQUENCY POWER CONVERSION

CROSS-REFERENCE TO RELATED APPLICATIONS

This application is a National Stage Entry of International Application No. PCT/US2022/052962, which was filed on Dec. 15, 2022, which claims the benefit under 35 U.S.C. § 119 of U.S. Provisional Patent Application No. 63/289,809 filed on Dec. 15, 2021. Each of these applications is hereby incorporated by reference herein in its entirety.

BACKGROUND

Many semiconductor processing applications, such as etching, require delivery of radio frequency (RF) power into a plasma load. To effectively source the necessary power from an RF amplifier at high efficiency, there is a need to dynamically match the variable impedance of the plasma load to that needed for the RF amplifier or RF generator. Moreover, to achieve the desired functionality, this power delivery should be precisely controllable with high bandwidth across a wide power range (e.g., enabling control across large, rapid steps in commanded power) despite rapid load impedance variations of the plasma. Lastly because of the need to provide accurate plasma control over a large spatial area, there is a desire for RF power delivery systems that can independently control RF power delivery to multiple outputs (e.g., for multiple spatially-distributed applicators).

SUMMARY

Tunable Impedance Matching

To facilitate effective use of RF power amplifiers/generators/inverters and to facilitate control of power to the load, there is often a need to provide dynamically-adjustable impedance matching between the RF source and the plasma load. Maintaining a well-controlled impedance match in such systems can be important for maintaining high efficiency of the RF power amplifier, for enabling the desired power delivery to the load, and for ensuring accuracy of control over the RF power. This is typically accomplished through use of a Tunable Matching Network (TMN), sometimes called a "Tunable Impedance Matching Network," an "Automatic Matching Unit" (AMU) or an "Antenna Tuning Unit" (ATU), which can sense and dynamically adjust the impedance match between the RF source and load over a specified operating range.

FIG. 1 shows an RF system 100 having a TMN 106 coupled between a source 102, having impedance $Z_S$, and a load 104, having impedance $Z_L$. A controller 108—which can be implemented using digital and/or analog circuitry—is coupled to provide control signals to TMN 106 for controlling operation thereof. In response to such control signals, TMN 106 provides a desired impedance transformation characteristic. That is, TMN 106 can be controlled to adjust, tune, change, or otherwise manipulate the impedance presented by TMN 106 to source 102 and/or load 104. For example, TMN 106 can be controlled to present a desired impedance, $Z_{S,IN}$, to TMN 106 from source 102 and a desired impedance, $Z_{L,IN}$, into TMN 106 from load 104.

Source 102, TMN 106, controller 108, and other elements of RF system 100 can be coupled to a power supply power supply voltage (e.g., VDC) and ground (not shown). In some cases, controller 108 may control operation of TMN 106 based, at least partially, upon information received from an optional feedforward circuit (not shown) coupled to source 102 and/or an optional feedback circuit (not shown) coupled to load 104. Feedforward information might include information about the effective input impedance of TMN 106, the timing of RF waveforms, specified signal levels and/or impedance levels, etc. Feedback information might include measured information about the effective load impedance and/or power reflected from the load, the timing of RF waveforms, etc.

One method for realizing dynamic impedance matching comprises a matching network (such as an L, T or Π-network) with passive component values that can be dynamically adjusted. FIG. 1A shows an illustrative implementation of an ideally-lossless, lumped-element TMN 120 based on a step-up L-match topology matching a load 124 impedance to a source (input) 122 impedance. The TMN 120 implementation includes adjustable elements 126*a*, 126*b* that can provide "step up" impedance matching. The range of impedances that can be matched with such a technique is shown in FIG. 1B using Smith chart 140. Adjustable elements 126*a*, 126*b* can be provided as various different adjustment mechanisms, such as mechanically-driven adjustable capacitors, switched capacitor and/or inductor banks, varactors (whose bias voltage is adjusted to modulate capacitance), and phase-switched impedance modulation, or PSIM, in which a passive energy-storage element is switched at the RF frequency to modulate an effective impedance. Various approaches of this sort may be characterized based on the range of load impedances they can match, the resolution with which matching can be provided, and the speed with which a desired impedance match can be realized (e.g., as limited by the adjustment rate of components).

There is a need for improved impedance control techniques and structures for use with applications that involve high response speeds across wide power and load impedance ranges, such as plasma applications.

High-Speed Power Control

Another challenge is controlling RF power accurately during large power steps, such as can occur in plasma "pulsing" as used in in modern RF plasma processing. During large power steps, it is possible to get significant short-term (e.g., 10's of microseconds) overshoots in RF power for that can cause deleterious effects in semiconductor processing applications. While this could potentially be addressed with sufficiently fast adaptation of impedance matching, short term control and limiting of RF power delivery on very fast (e.g., 10 μs) time scales may be considered a phenomenon worth addressing in itself. One possibility to address this is the development of RF power amplifiers or RF generators having sufficient high-bandwidth power control capability in the face of large command steps and large load impedance changes.

Multiple-Output Power Distribution and Control

A further area of interest is the development of RF power delivery systems able to control RF power independently to multiple outputs (possibly from a single RF power source). Multiple outputs can allow for spatial control and uniformity adjustment of plasma. While, multiple "parallel" delivery systems capable of addressing mutual load pull effects are one possibility, it would be desirable to develop systems that are extensible to multiple outputs (e.g., two, three, or even more outputs) from a single RF generator/power amplifier and/or from a single RF source and matching system.

Controllable Transformation Networks

Described herein are improved RF power conversion structures and techniques for addressing the challenges described above. A key approach introduced here is the use of two-port switching networks that can achieve controllable voltage transformation from an RF input to an RF output. The switching network may be operated synchronously with an RF signal to be transformed and acts approximately as a controllable transformer. That is, it can act as having a dynamically-tunable effective turns ratio that depends upon the timing of the switching with respect to the RF signal.

According to one aspect of the present disclosure, a system for transforming a radio frequency (RF) signal between a source and a load can include: a first port and a second port connected to different ones of the source and the load; a first filter connected to the first port; a second filter connected to the second port, at least one of the first and second filters operable to provide variable reactance using dynamic frequency tuning (DFT); a two-port switching network connected between the first filter and the second filter, the switching network comprising a plurality of switches; and a controller coupled to the switching network and to the source, the controller configured to operate the plurality of switches according to a switching pattern and to dynamically adjust a frequency of the RF signal to provide controllable impedance matching between the first port and the second port.

In some embodiments, the first filter may be configured to extract a fundamental voltage of the RF signal. In some embodiments, the first filter may include a capacitor and an inductor connected in parallel across terminals of the first port. In some embodiments, the second filter may be configured to extract a fundamental current of the RF signal. In some embodiments, the second filter may include a capacitor and an inductor connected in series with one terminal of the second port. In some embodiments, the controller may operate the plurality of switches synchronously with the RF signal and with a controllable phase shift with respect to the RF signal. In some embodiments, the controller may operate the two or more switches according to a switching pattern defined by an angle β with respect to the RF signal. In some embodiments, the controller may be configured to calculate β in terms of load resistance $R_L$ and reactance $X_L$. In some embodiments, the controller may be configured to select switching frequency in terms of load resistance $R_L$ and reactance $X_L$.

In some embodiments, the load may include a plasma load. In some embodiments, the controller may be configured to provide controllable impedance matching between the first port and the second port during power steps over at least a factor of two that occur in 10 μs or less.

In some embodiments, the plurality of switches may include four switches arranged in a bridge circuit. In some embodiments, the four switches may include unidirectional blocking, bidirectional carrying switches.

In some embodiments, the four switches may include: a first switch having a first terminal connected to a first terminal of the first filter and having a second terminal connected to a first terminal of the second filter; a second switch having a first terminal connected to a second terminal of the first filter and having a second terminal connected to a second terminal of the second filter; a third switch having a first terminal connected to the second terminal of the first switch and to the first terminal of the second filter; and a fourth switch having a first terminal connected to the second terminal of the second switch and to the second terminal of the second filter, and having a second terminal connected to a second terminal of the third switch.

In some embodiments, the four switches may include: a first switch having a first terminal connected to a first terminal of the first filter and having a second terminal connected to a first terminal of the second filter; a second switch having a first terminal connected to the first terminal of the second filter and to the second terminal of the first switch, and having a second terminal connected to a second terminal of the first filter; a third switch having a first terminal connected to the second terminal of the first filter and to the second terminal of the second switch, and having a second terminal connected to a second terminal of the second filter; and a fourth switch having a first terminal connected to the second terminal of the second filter and to the second terminal of the third switch, and having a second terminal connected to a third terminal of the first filter.

According to another aspect of the present disclosure, a controllable transformation network for transforming a radio frequency (RF) signal between a source and a load may include: a first port and a second port connected to different ones of the source and the load; a first filter connected to the first port and configured to extract a fundamental voltage of the RF signal; a second filter connected to the second port and configured to extract a fundamental current of the RF signal, at least one of the first and second filters operable to provide variable reactance using dynamic frequency tuning (DFT); and a switching network connected between the first filter and the second filter, the switching network comprising a bridge circuit with four switches.

In some embodiments, wherein the first filter may include a capacitor and an inductor connected in parallel across terminals of the first port. In some embodiments, the second filter may include a capacitor and an inductor connected in series with one terminal of the second port. In some embodiments, the four switches may be connected in a manner described above.

It should be appreciated that individual elements of different embodiments described herein may be combined to form other embodiments not specifically set forth above. Various elements, which are described in the context of a single embodiment, may also be provided separately or in any suitable sub-combination. It should also be appreciated that other embodiments not specifically described herein are also within the scope of the following claims.

BRIEF DESCRIPTION OF THE DRAWINGS

The manner of making and using the disclosed subject matter may be appreciated by reference to the detailed description in connection with the drawings, in which like reference numerals identify like elements.

The drawings are not necessarily to scale, or inclusive of all elements of a system, emphasis instead generally being placed upon illustrating the concepts, structures, and techniques sought to be protected herein.

DETAILED DESCRIPTION

Controllable Transformation Networks

Figure 1:
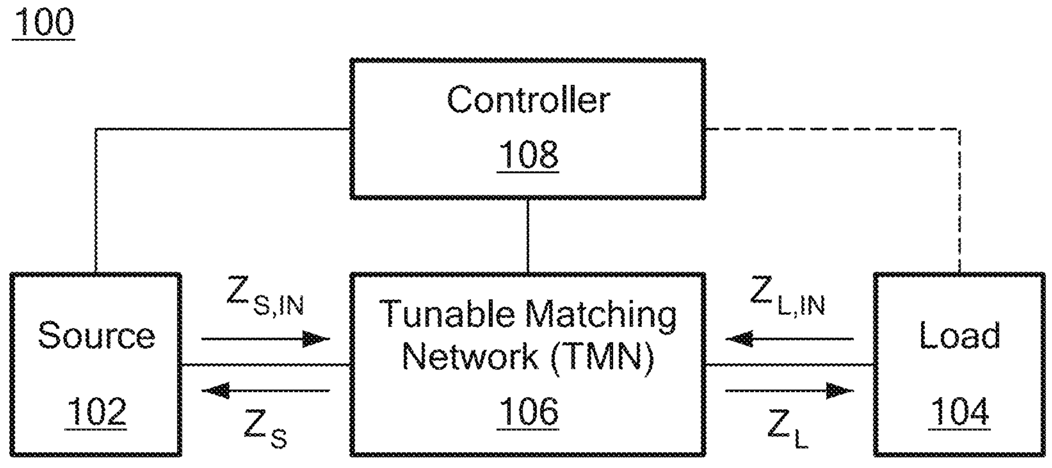
FIG. 1 is a block diagram of a prior art RF system having a tunable impedance matching network (TMN).
Figure 1A:
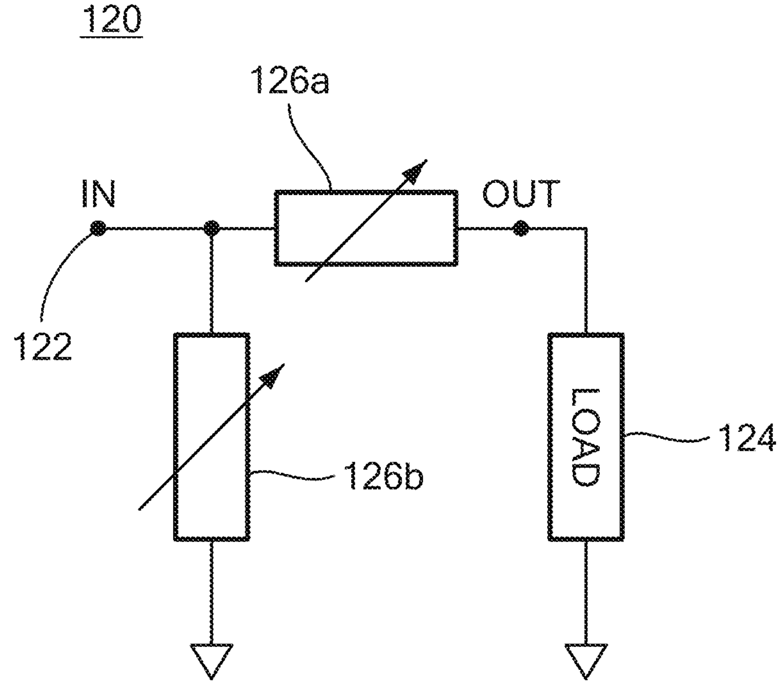
FIG. 1A is circuit diagram showing an illustrative implementation of an ideally-lossless, lumped-element TMN based on a step-up L-match topology.
Figure 1B:
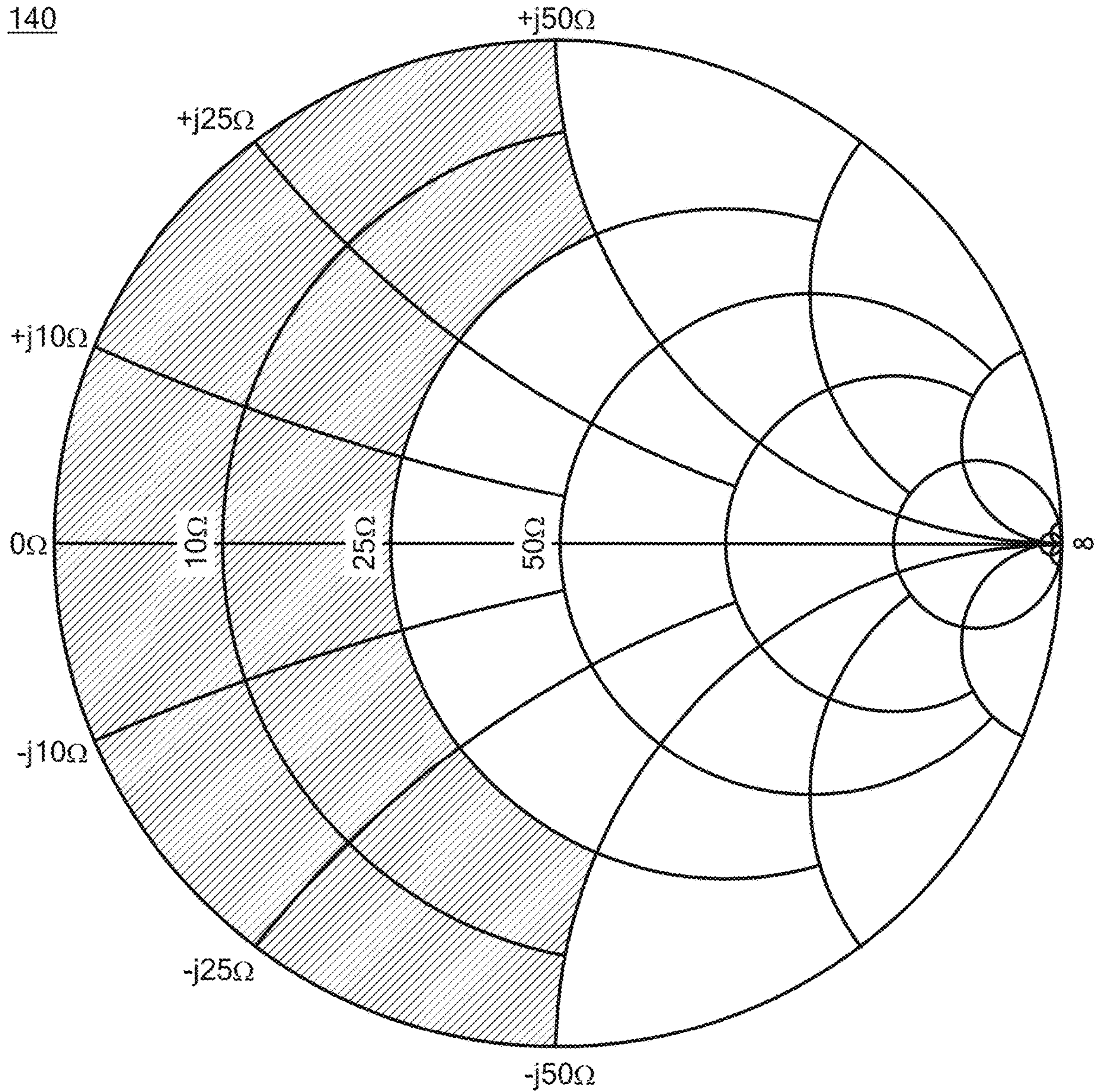
FIG. 1B is a Smith chart illustrating the range of load impedances that can be matched to a desired 50 Ohm input impedance using a TMN such as that illustrated in FIG. 1A.
Figure 2:
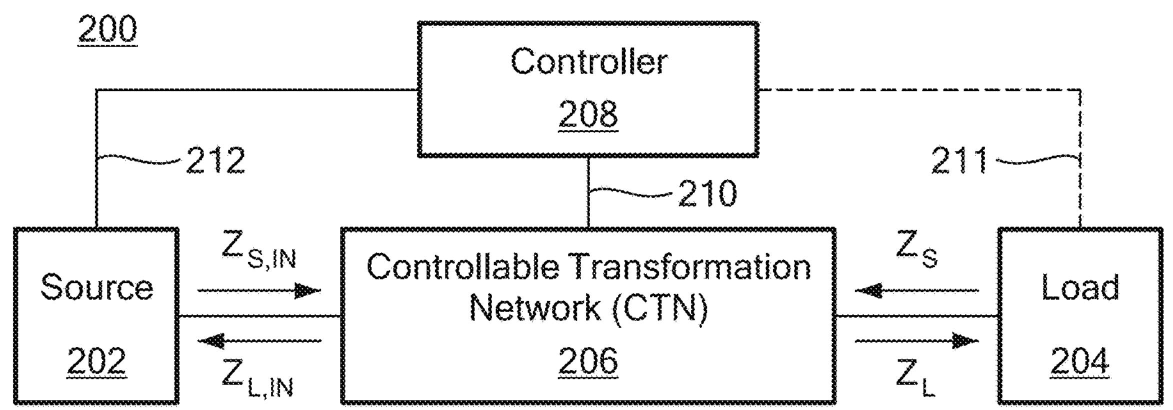
FIG. 2 is a block diagram of an RF system having a controllable transformation network (CTN), according to embodiments of the present disclosure.

FIG. 2 shows an RF system 200 having a controllable transformation network (CTN) 206 that can be used to provide tunable impedance matching between an RF source 202, having impedance $Z_S$, and load 204, having impedance $Z_L$. A controller 208—which can be implemented using digital and/or analog circuitry—is coupled to provide control signals 210 to CTN 206 for controlling operation thereof. In response to such control signals, CTN 206 provides a desired impedance transformation characteristic. That is, CTN 206 can be controlled to adjust, tune, change, or otherwise manipulate the impedance presented by CTN 206 to source 202 and/or load 204. For example, CTN 206 can be controlled to present a desired impedance, $Z_{S,IN}$ at the source-side port of CTN 206 to source 202 and a desired output impedance, $Z_S$, from CTN 206 to load 204 in the face of variations of impedance $Z_L$ presented by load 204. Controller 208 may also be coupled to provide control signals 212 to source 202, e.g., for dynamically adjusting the frequency of the source RF signal. In some embodiments, controller 208 may receive signals from load 204, such as impedance measurements looking into the load, as represented by line 211.

Source 202, CTN 206, controller 208, and other elements of RF system 200 can be coupled to a power supply power supply voltage (e.g., VDC) and ground (not shown).

Figure 2A:
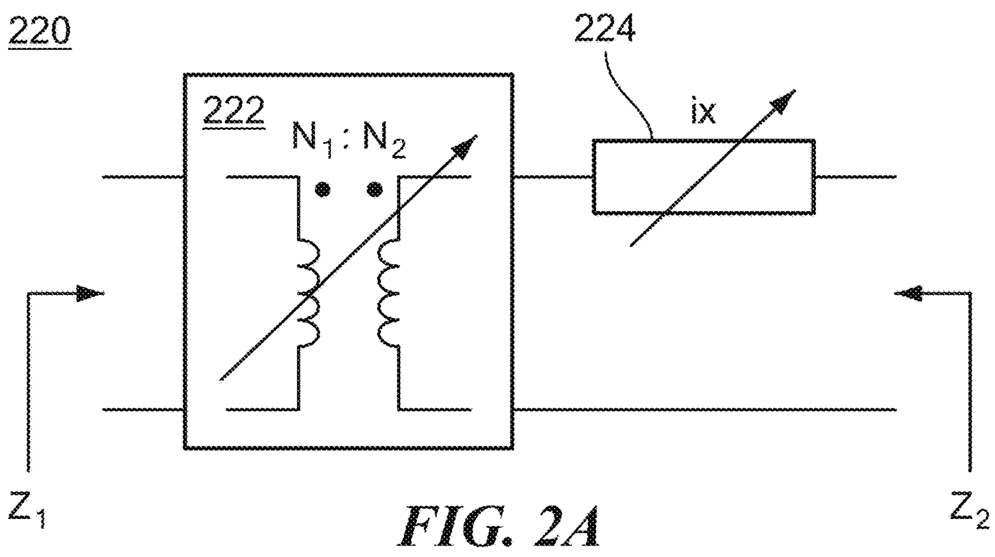
FIGS. 2A and 2B are circuit diagram showing how a CTN can realized with a two-port switching network that acts as a controllable transformer and an effective variable reactance, according to some embodiments.

Turning to FIG. 2A, an illustrative CTN 220 can include a two-port switching network 222 configured to achieve controllable voltage transformation (e.g., tunable matching). The two port switching network 222 acts as a primary means to provide transformation between an RF impedance level $Z_1$ on one side of the CTN 220 to an RF impedance level $Z_2$ on the other side of the CTN 220. Here, the RF input may correspond to either a source or a load, and the RF output may correspond to the other. The switching network 222 may be operated synchronously with an RF signal to be transformed and may act approximately as a controllable transformer, as illustrated in FIG. 2A (with specific implementations described below in the context of subsequent figures). That is, it can act as having a dynamically-tunable effective turns ratio ($N_1$:$N_2$) that depends upon the timing of the switching with respect to the RF signal.

A secondary tuning means 224 may be coupled to the switching network 222 to realize a CTN that can be used to provide tunable impedance matching between an RF source and load. Secondary tuning means 224 of FIG. 2A may provide series reactance tuning. The secondary tuning means 224 may be a variable reactance X, providing reactive impedance jX, realized with filters coupled to the switching network 222, as described further below. In some embodiments, a variable reactance can be implemented with a high quality-factor "Q" resonant tank and Dynamic Frequency Tuning (DFT). DFT is a technique in which the frequency of an RF power supply or source is adjusted such that the impedance or admittance provided by a frequency-sensitive reactive or susceptive network is varied in a desirable fashion, and has been applied for impedance tuning in plasma and other applications.

In the example of FIG. 2A, secondary tuning means 224 is coupled to one output terminal of switching network 222.

Figure 2B:
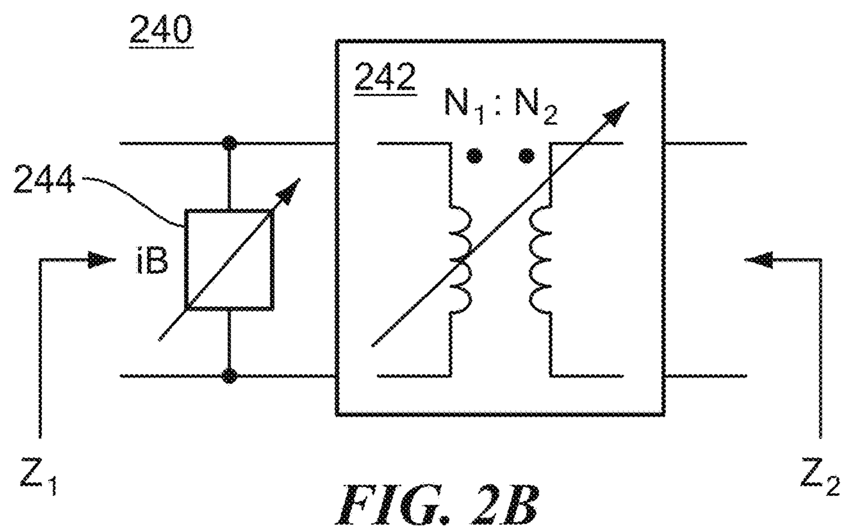

FIG. 2B shows another example of a CTN 240 whereby a secondary tuning means 244—such as a susceptive admittance Y=jB—is coupled across both input terminals of a two-port switching network 242. Secondary tuning means 244 of FIG. 2B may provide shunt susceptance tuning.

Figure 3:
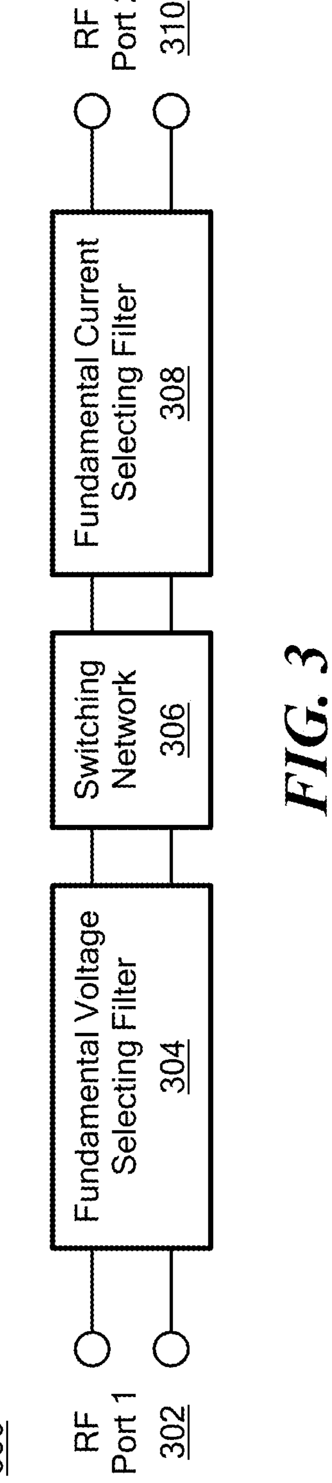
FIG. 3 is a block diagram showing a CTN architecture having an input-side filter, a switching network, and an output-side filter, according to some embodiments.

FIG. 3 shows an architecture that can be used to implement a CTN, according to some embodiments. An illustrative CTN architecture 300 can include a first (or "input") RF port 302, a first (or "input-side") filter 304, a switching network 306, a second (or "output-side") filter 308, and a second (or "output") RF port 310, coupled as shown. The first RF port 302 may be coupled to either an RF source or load, with the second RF port 310 coupled to the other.

As shown in FIG. 3, first filter 304 may comprise fundamental voltage selecting filter, and second filter 308 may comprise a fundamental current selecting filter. One or both of the filters 304, 308 can be used with DFT to provide a variable reactance. The switching network 306 can be switched synchronously with an RF signal provided at first port 302 to provide variable transformation. Together, the switching network 306 and filters 304, 308 enable controllable impedance matching with high bandwidth between first RF port 302 and second RF port 310.

Figure 3A:
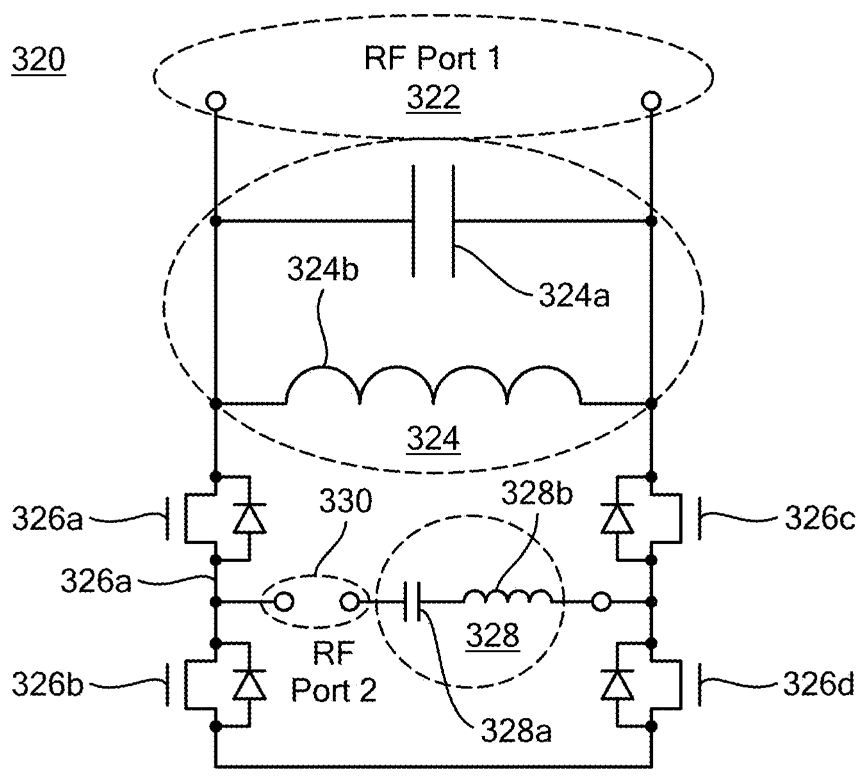
FIGS. 3A and 3B are circuit diagrams showing two implementations of the CTN architecture of FIG. 3, according to some embodiments.
Figure 3B:
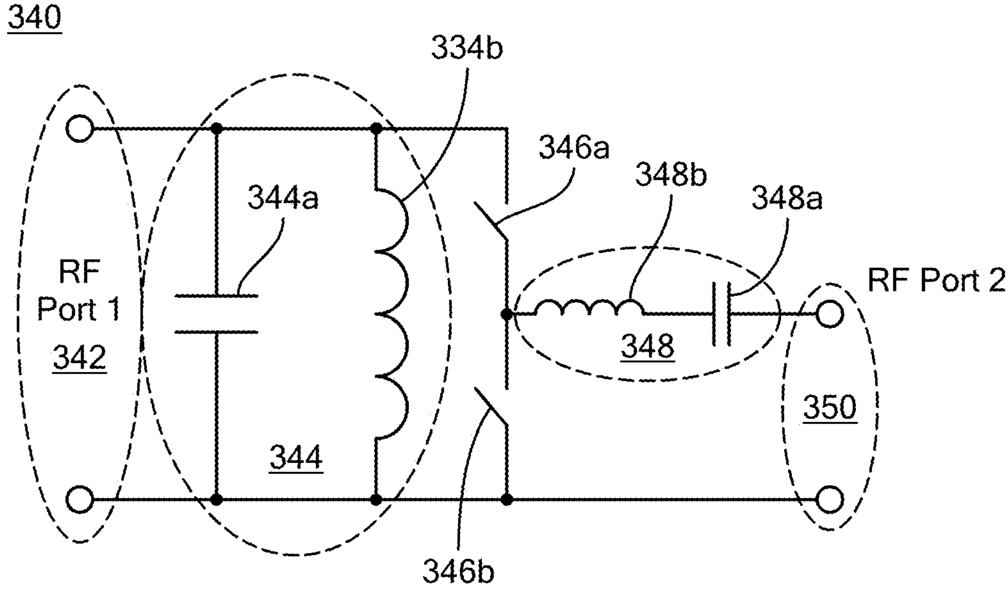

FIGS. 3A and 3B show examples of a CTN circuit implementations that utilize the architecture of FIG. 3. It will be appreciated that many implementations of this general approach are possible.

Turning to FIG. 3A, illustrative circuit 320 includes a first RF port 322 coupled to a fundamental voltage selecting filter 324 and a second RF port 330 coupled to a fundamental current selecting filter 328. A switching network comprising switches 326*a-d* can be coupled between filters 324, 328, as shown. In some examples, switches 326*a-d* may be provided as field-effect transistors (FETs), high-electron-mobility transistors (HEMTs), bipolar junction transistors (BJTs) or heterojunction bipolar transistors (HBTs), however other active or passive components may be used in some cases. In general, any type of unidirectional blocking, bidirectional carrying switching elements may be used. This generally applies to any of the CTN implementations shown or described herein.

As shown, fundamental voltage selecting filter 324 can include a first capacitor 324*a* and a first inductor 324*b* coupled in parallel and across the terminals of first RF port 322. Fundamental current selecting filter 328 can include a second capacitor 328*a* and a second inductor 328*b* coupled in series between one terminal of second RF port 330 and between switches 326*c*, 326*d*.

Filters 324 and 328 may be designed so as to extract the fundamental voltage and current, respectively, of the RF signal being transformed. As such, the values of capacitors 324*a*, 328*a* and inductors 324*b*, 328*b* may be selected based on the nominal operating frequency for a given RF application for which circuit 320 is deployed. They may also be selected to provide a high frequency selectivity or net quality factor Q considering the respective impedance levels they connect to. This generally applies to any of the CTN implementations shown or described herein.

Turning to FIG. 3B, another illustrative circuit 340 includes a first RF port 342 coupled to a fundamental voltage selecting filter 344 and a second RF port 350 coupled to a fundamental current selecting filter 348. A switching network comprising switches 346*a*, 346*b* can be coupled between filters 344, 348, as shown. Fundamental voltage selecting filter 344 can include a first capacitor 344*a* and a first inductor 344*b* coupled in parallel and across the terminals of first RF port 342. Fundamental current selecting filter 348 can include a second capacitor 348*a* and a second inductor 348*b* coupled in series between one terminal of second RF port 350 and between switches 346*a*, 346*b*. While only two switches 346*a*, 346*b* are shown in FIG. 3B, the switches are bidirectional blocking and bidirectional carrying, so in some cases each of the shown switches may be realized as two unidirectional blocking bidirectional carrying switches (e.g., in "anti" series) or two bidirectional blocking unidirectional carrying switches (e.g., in "anti" parallel).

Figure 4:
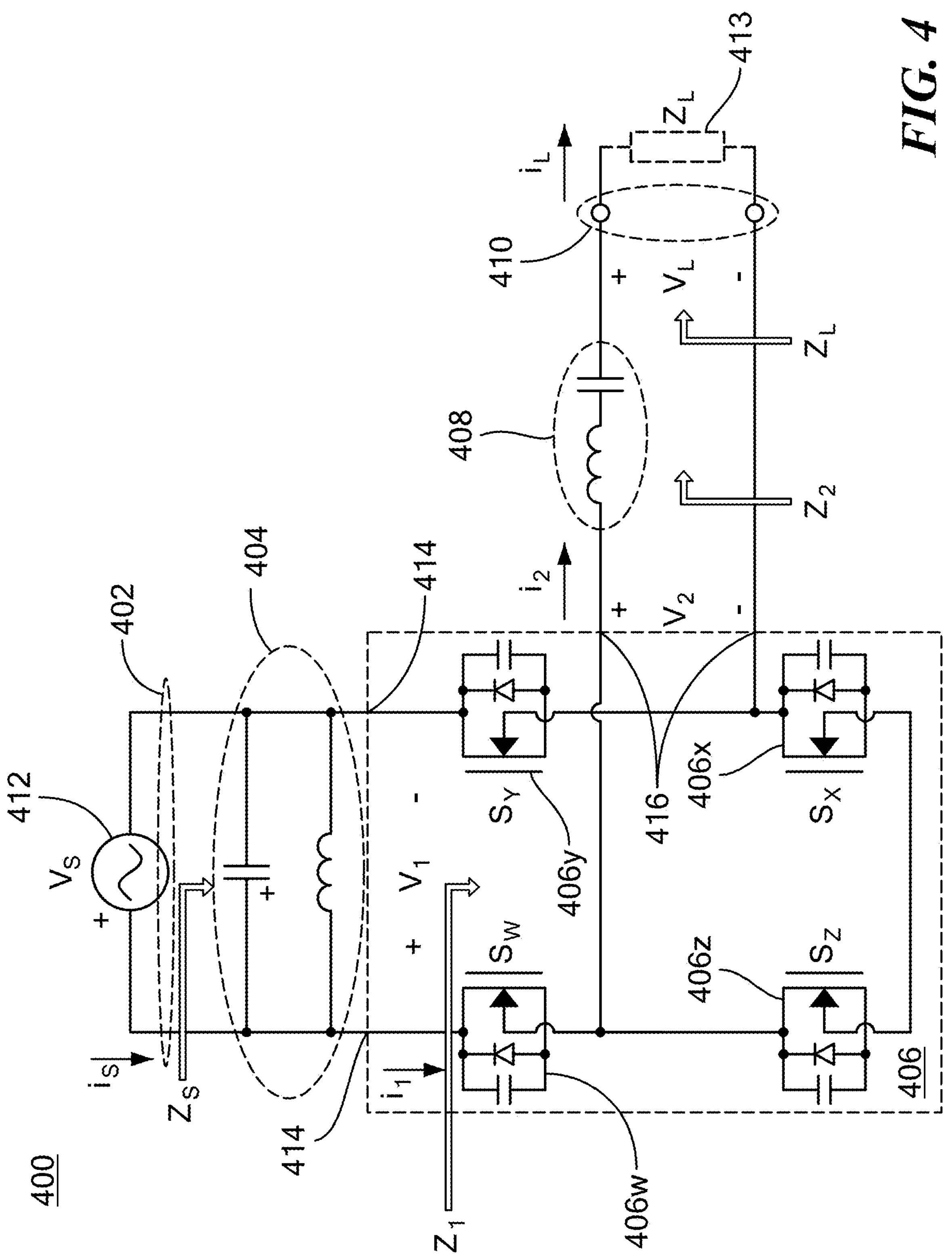
FIG. 4 is circuit diagram showing the circuit of FIG. 3A connected to an RF source and load.
Figure 4A:
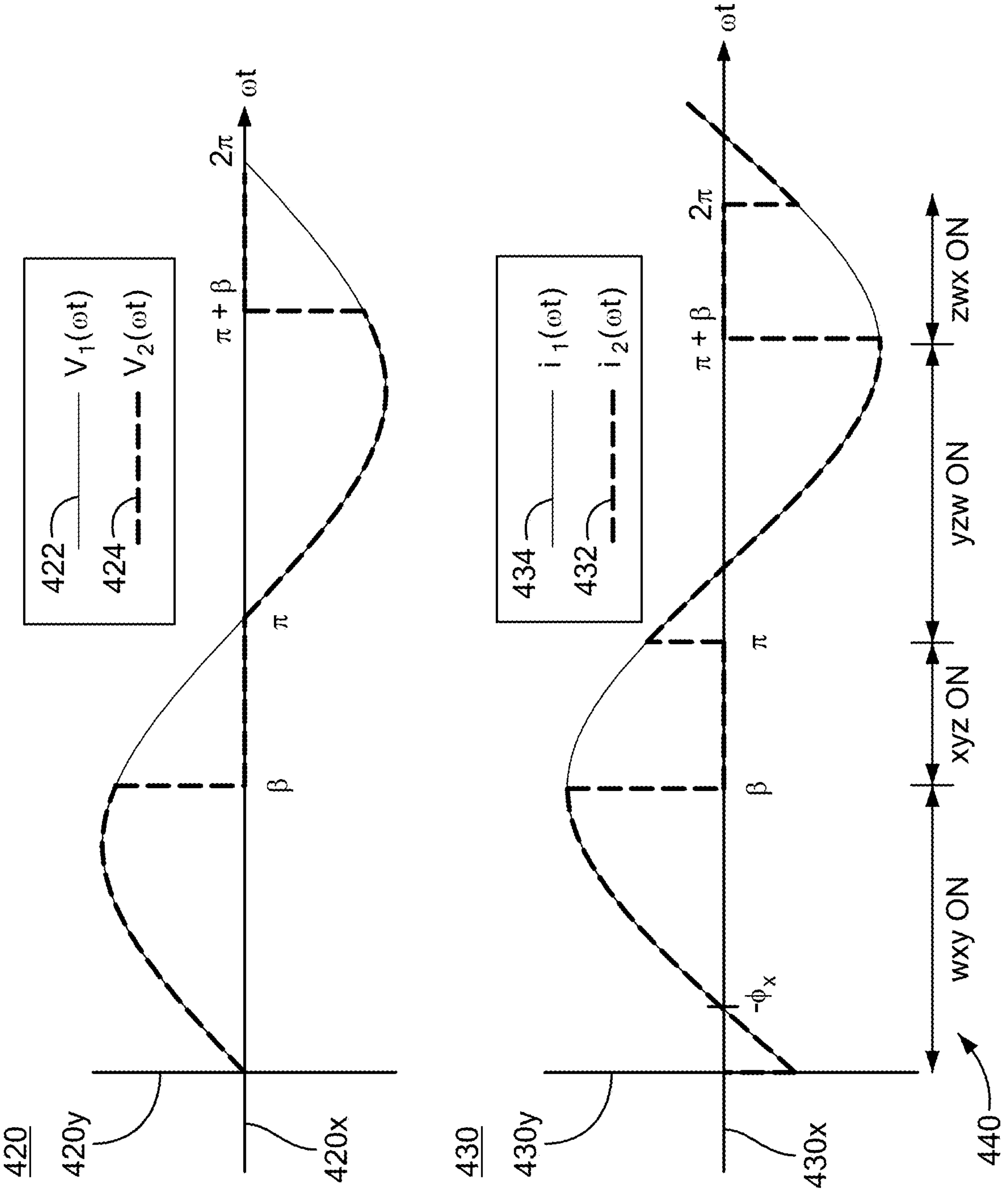
FIG. 4A shows switching patterns that may be used to control a CTN circuit, such as that of FIG. 4, and associated waveforms, according to some embodiments.

FIG. 4, in combination with FIG. 4A, illustrates the switching operation of a CTN circuit implementation based on that of FIG. 3A, according to some embodiments.

An illustrative circuit 400 includes a first RF port 402 coupled to a fundamental voltage selecting filter 404, a second RF port 410 coupled to a fundamental current selecting filter 408, and a switching network 406 coupled between filters 404, 408, as shown. In the example of FIG. 4, a source 412 (e.g., a voltage source) is coupled to first port 402 and a load 413 (e.g., a restive load) is be coupled to second port 410. In other examples, a load may be coupled to first port 402 and a source may be coupled to second port 410.

As denoted in the figure, source 412 can see an input impedance $Z_S$ and provide, as input, an RF signal have voltage Vs and current Is. Source 412 may have some equivalent output impedance (or Thevenin output impedance) not shown, which may be an impedance $Z_S$. Load 413 can have impedance $Z_L$ and receive a transformed/converted RF signal having voltage $V_L$ and current IL. Fundamental voltage selecting filter 404 can filter the input RF signal to provide a filtered RF signal to a first port 414 of switching network 406, the filtered RF signal having voltage $V_1$ and current $I_1$, and $Z_1$ denoting the impedance at port 414. By impedance $Z_1$, it is meant the ratio of the fundamental complex voltage component to the fundamental complex current component at that port. Switching network 406 includes four switches 406*w-z* which can be arranged as shown and operated according to one or more switching patterns (or "switching waveforms"). In more detail, a controller (e.g., controller 208 of FIG. 2) can provide control signals to individual switches 406*w-z* to turn them on and off at different times according to a switching pattern. As a result, switching network 406 can output a transformed RF signal at a second port 416, the transformed RF signal having voltage $V_2$ and current $I_2$, and $Z_2$ representing the ratio of the fundamental complex voltage component of $V_2$ to the fundamental complex current component of $I_2$, thus denoting the impedance at port 416. Fundamental current selecting filter 408 can filter the transformed RF signal to provide an output signal to the load 413 having impedance $Z_L$, the output signal having voltage $V_L$ and current IL.

Turning to FIG. 4A, in the circuit 400 of FIG. 4, step down of the fundamental voltage from first port 414 to second port 416 (i.e., $V_1$ to $V_2$) and step up of fundamental current (i.e., $I_1$ to $I_2$) between these ports can be controlled according to a switching angle, B, where $\beta$ is between 0 and $\pi$.

A first plot 420 has a horizontal axis 420*x* representing angle ($\omega t$) and a vertical axis 420*y* representing voltage. A second plot 430 has a horizontal axis 430*x* representing angle ($\omega t$) and a vertical axis 430*y* representing current. Each of the four switches 406*w-z* can be turned on and off once per RF cycle according to $\beta$, with a single cycle illustrated in FIG. 4A. For example, as indicated by legend 440, between angles $\theta$ and $\beta$, switches 406*w,x,y* can be on and switch 406*z* can be off; between angle $\beta$ and I, switches 406*x,y,z* can be on and switch 406*w* can be off; between angle $\pi$ and $\pi+\beta$, switches 406*y,z, w* can be on and switch 406*x* can be off; and between $\pi+\beta$ and $2\pi$, switches 406*z, w,x* can be on and switch 406*y* can be off. It is recognized that in practice there may be certain additional deadtimes between complementary switch pairs such as switches W and Z and switches X and Y (when both switches in a complementary pair are held off) which not indicated in the timing diagram, such as to enable transitions for zero-voltage switching, as is known in the art of switching converters. Angle $-\phi_x$ represents a phase shift between the fundamental of voltage $V_2$ and of current $I_1$ components that may occur in desired operation of the system.

Referring to plot 420, waveform 422 represents $V_1$ and waveform 424 represents $V_2$. As seen, $V_2$ is zero between $\beta$ and $\pi$, when switch 406*x* is off, and between $\pi+\beta$ and $2\pi$, when switch 406*y* is off. Elsewhere, $V_2$ matches $V_1$ (i.e., waveforms 422 and 424 overlap).

Referring to plot 430, waveform 432 represents $I_1$ and waveform 434 represents $I_2$. As seem, $I_1$ is zero between $\beta$ and $\pi$, when switch 406*x* is off, and between $\pi+\beta$ and $2\pi$, when switch 406*y* is off. Elsewhere, $I_1$ matches $I_2$ (i.e., waveforms 432 and 434 overlap). This idealization neglects transitions of voltage $V_2$ and $I_1$ that may occur in practice in conjunction with the aforementioned deadtimes.

Essentially, the switching network 406 acts like a nonideal transformer for the fundamental components of the voltage and current waveforms between ports 414, 416. It is non-ideal in that there may be phase shifts between the fundamental components of the voltages and/or currents at ports 414, 416 that depend upon the angle β. Nonetheless, the switching network essentially acts to provide a timing dependent step-down in fundamental voltage and step up in fundamental current from first port 414 to second port 416. In some embodiments, the effect of any phase shifts through the switching network can be compensated for using the secondary control handle (e.g., DFT associated with an admittance jB and/or impedance jY such as using the input and/or output filter networks), and thus achieve overall impedance matching between ports 414 and 416.

Benefits of the combined with the switching pattern of FIG. 4A, used with the circuit topology of FIG. 4, is that it requires a single switching cycle per device per RF cycle, and that all switching transitions can be made with zero-voltage switching (ZVS) for low loss when appropriate deadtimes are included in the switching pattern. Of course, many other topologies and switching patterns may be realized with a 2-port switching structure and associated elements to provide impedance matching.

Figure 5A:
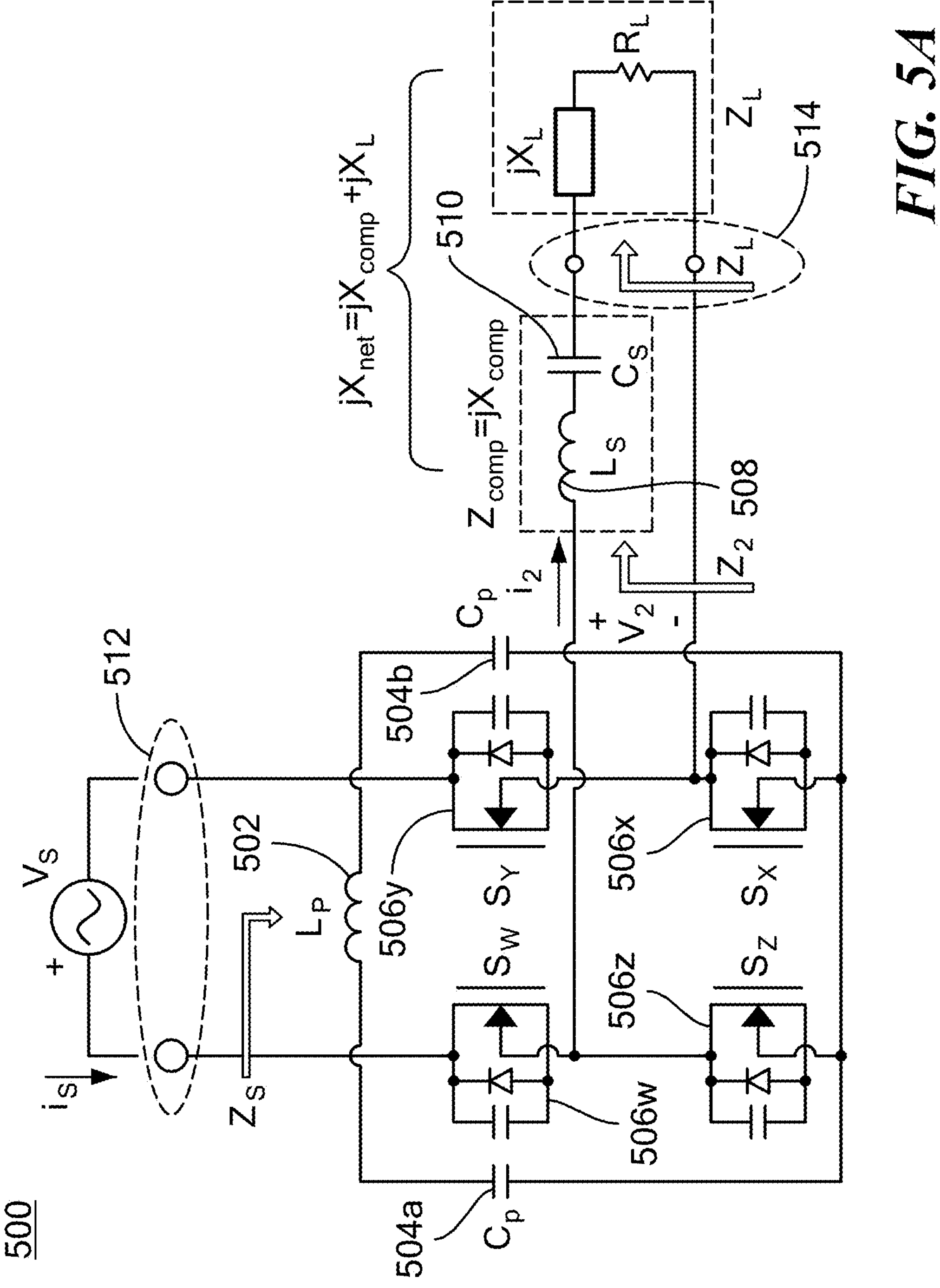
FIGS. 5A and 5B are circuit diagrams showing another implementation of the CTN architecture of FIG. 3, according to some embodiments.
Figure 5B:
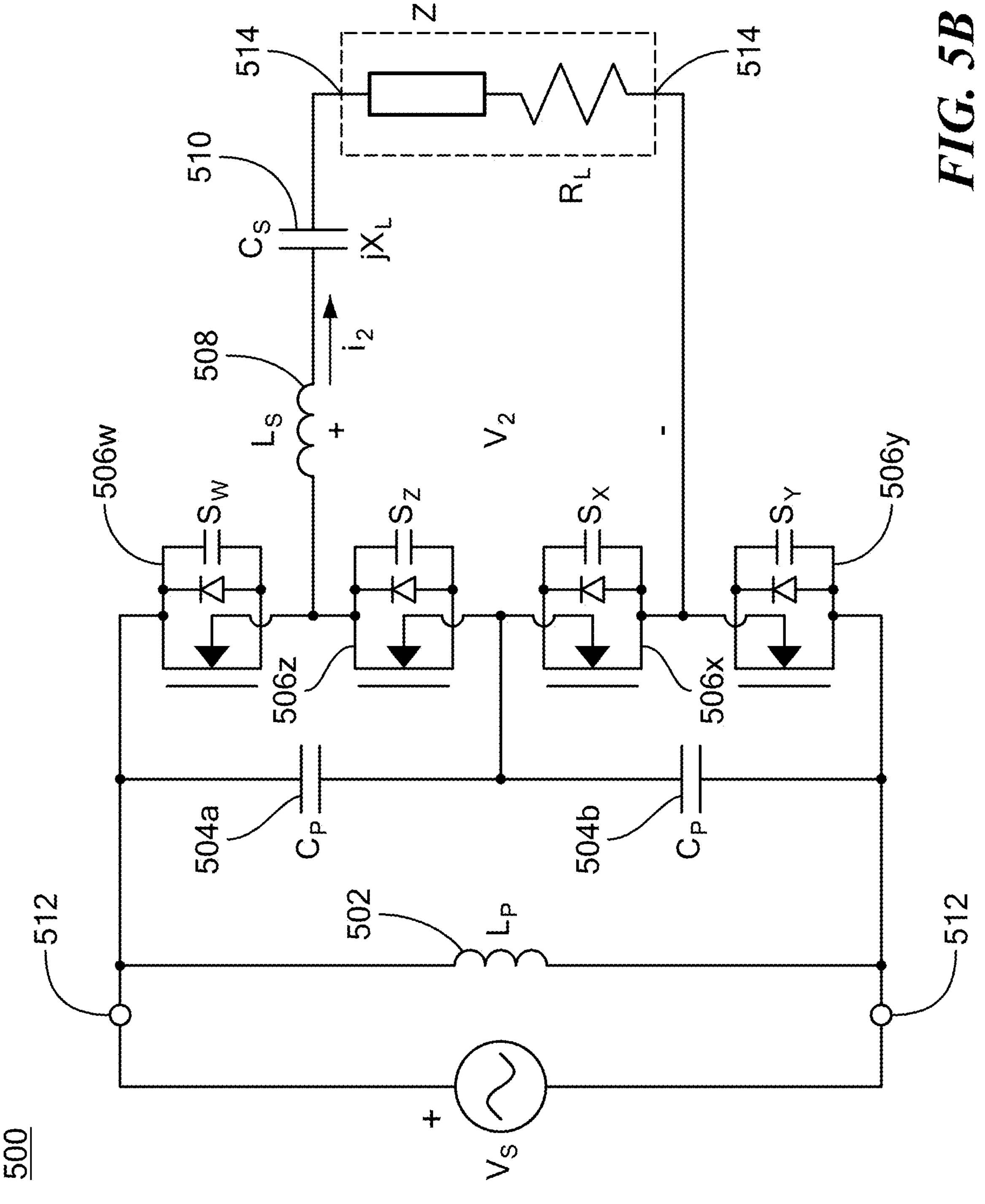

FIGS. 5A and 5B shows two different views of another CTN circuit implementation, according to embodiments of the present disclosure. Illustrative circuit 500 is similar to circuit 400 of FIG. 4, with both being based on the CTN architecture of FIG. 3. Here, the fundament voltage selecting filter comprises inductor 502 ($L_P$) and two capacitors 504*a*, 504*b* (Cp), the switching network comprises four switches 506*w-z*, and fundamental current selecting filter comprises inductor 508 and capacitor 510.

Thus, in contrast to the implementation of FIG. 4, circuit 500 has capacitor Cp replicated between the left-half bridge and the right-half bridge of the switching network, as shown. In operation, each capacitor 504*a*, 504*b* (Cp) can be used in one half of the RF cycle. That is, in each half-cycle of operation, one bridge leg can be shorted and the other can provide the switching for controllable transformation, such that one of the capacitors 504*a*, 504*b* is used in each half cycle.

The illustrative circuit 500 is shown as stepping up impedance from a load a second port 514 to a source at first port 512. It can also be operated in the reverse direction, by stepping down a load impedance at first port 512 to a source impedance at second port 514.

The switching patterns/waveforms used with the circuit 500 of FIG. 5 can be the same as or similar to those shown in FIG. 4A, with similar switch timings. Each device (i.e., switch) thus switches once per cycle, with ZVS switching of all devices. In some embodiments, wherein the fundament current selecting filter (i.e., inductor 508 and capacitor 510 or Ls-Cs) is realized at high quality factor, variation of the RF frequency can be used to vary the effective impedance presented thereby (i.e., by DFT). That is, a controller (e.g., controller 208 of FIG. 2) can send control signals to adjust the frequency of an RF power supply (e.g., source 202 of FIG. 2). Thus, according to some embodiments, DFT can be used to provide reactance compensation for the load impedance, the effect of the transformation network, and/or the input filter network. With appropriate DFT and switching control angle, B, a desired resistive input impedance, $Z_S$, can be achieved that is greater than or equal to the real part of the load impedance, $R_L$.

As compared to many matching systems in which variable effective reactances (i.e., single-port elements) are used, the embodiments of FIGS. 4, 5A, and 5B utilize a two-port switching network that acts as a variable transformer (i.e., a variable two-port device).

Figure 6:
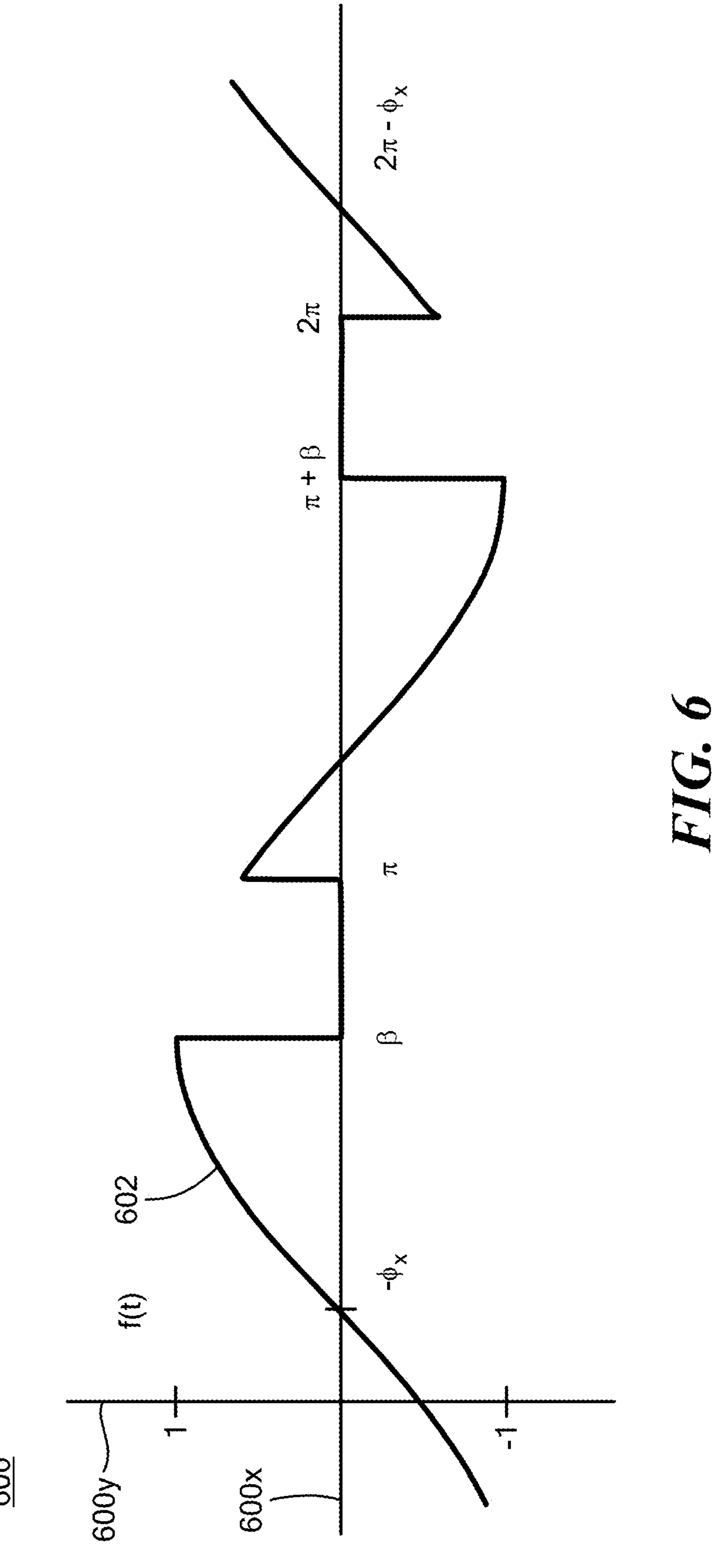
FIG. 6 shows a representative waveform that can result from switching in a CTN circuit, such as that of FIG. 4, 5A, or 5B, according to the present disclosure.

FIG. 6 is a plot 600 having horizontal axis 600*x* representing signal angle (ωt) and a vertical axis 600*y* representing the value of a normalized signal f(t). The voltage, current, and impedance transformation provided by the controllable transformation networks of FIGS. 4, 5A, and 5B can be determined using information about the magnitude and phase of the fundamental component of waveform 602, f(t), defined as:

$$f(t) = \begin{cases} 0 & \beta < \omega t < \pi \\ & \beta + \pi < \omega t < 2\pi \\ \sin(\omega t + \phi_t) & \text{otherwise} \end{cases}$$

The fundamental component of this waveform can be expressed as $$f_1(t) = M\sin(\omega t + \psi)$$

where $$M = M(\beta, \phi_x) = \sqrt{\frac{\beta^2}{\pi^2} + \frac{1}{\pi^2}\sin^2(\beta) - \frac{2\beta}{\pi^2}\sin(\beta)\cos(\beta + 2\phi_x)}$$

$$\psi = \psi(\beta, \phi_x) = \tan^{-1}\frac{\beta\sin(\phi_x) + \sin(\beta)\sin(\beta + \phi_x)}{\beta\cos(\phi_x) - \sin(\beta)\cos(\beta + \phi_x)}$$

Analyzing the waveforms in FIG. 4A, one can identify the idealized values of secondary-side reactance $X_{comp}$ and switching angle β to match the input impedance $Z_S$ to a desired value $Z_0$. The specific idealized control variables can be found by solving:

$$X_{net} = R_L\frac{2\beta\sin^2(\beta)}{\beta^2 - \sin^2(\beta)\cos^2(\beta) - \sin^4(\beta)}$$

$$\frac{R_L}{Z_0} = \frac{1}{\pi}\frac{\sqrt{\beta^2 + \sin^2(\beta) - 2\beta\sin(\beta)\cos(\beta)}}{\sqrt{1 + \left[\frac{2\beta\sin^2(\beta)}{\beta^2 - \sin^2(\beta)\cos^2(\beta) - \sin^4(\beta)}\right]^2}}M\left(\tan^{-1}\frac{-\sin^2(\beta)}{\beta + \sin(\beta)\cos(\beta)}\right)$$

Figure 7:
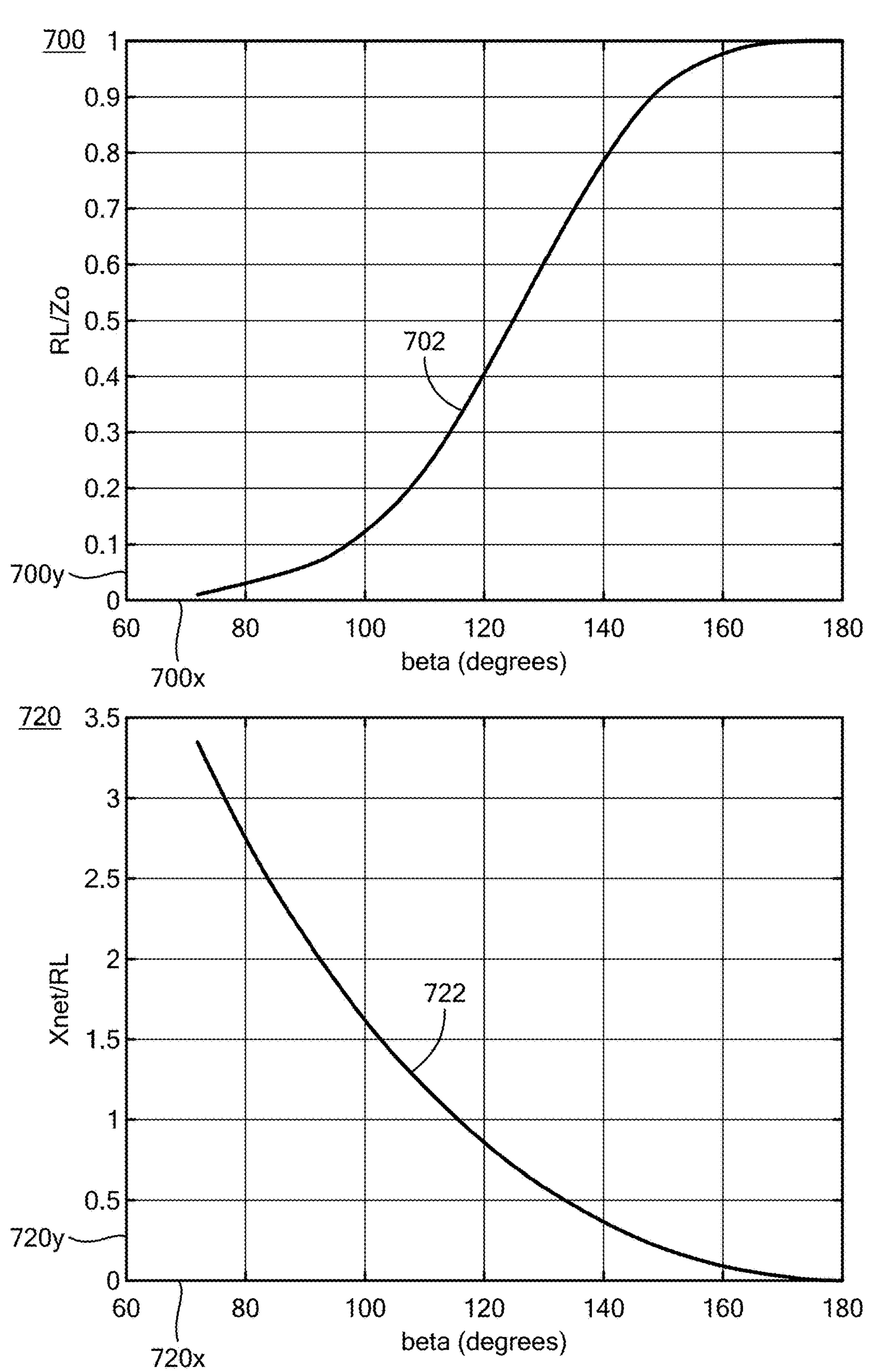
FIG. 7 shows curves of ideal control angles that can be generated for a CTN circuit, such as that of FIG. 4, 5A, or 5B, according to some embodiments.

Using the above equations, a set of curves can be generated as shown in FIG. 7. A first plot 700 includes a curve 702 of $R_L/Z_0$ (vertical axis 700*y*) plotted over switching angle, β, (horizontal axis 700*x*, degrees). A second plot 720 includes a curve 722 of $X_{net}/R_L$ (vertical axis 720*y*) plotted over switching angle, B, (horizontal axis 720*x*, degrees).

Curves similar to 702, 704 may be generated for different CTN circuit implementations and switching patterns disclosed herein, including but not limited to those of FIGS. 4, 4A, 5A, and 5B, using the general concepts and techniques disclosed herein.

Curves 702, 722 can be used to select/calculate (and in some cases make an idealized selection/calculation of) secondary-side reactance $X_{comp}$ and switching angle β in terms of load resistance $R_L$ and reactance $X_L$ (where $X_{comp}=X_{net}-X_L$). In particular, the following procedure may be followed to select $X_{comp}$ and β:

1. Start with known load resistance $R_L$, load reactance $X_L$ and desired impedance value $Z_0$.
2. Use curve 702 to find β.
3. Use curve 722 to find $X_{net}/R_L$ and hence $X_{net}$.

4. Determine $X_{comp}$ from $X_{net}/R_L$ where $X_{comp}$ is the difference between $X_{net}$ and $X_L$.

The above procedure may be implemented within and/or applied to various disclosed CTN systems and circuits to provide impedance matching between an RF source and load while minimizing phase shift. For example, controller 208 of FIG. 2 may include hardware and/or software configured to generate curves similar to those shown in FIG. 7 and to rapidly select and adjust RF frequency and switching angle, β, using the above procedure, where compensating reactance $X_{comp}$ is generated by dynamic frequency tuning with the net reactance provided by $L_S$ and $C_S$. As another example, the selected switching angle, β, can be applied to any of the circuits of FIGS. 4, 5A, and 5B.

With the above model, it may be assumed that the input filter network is at resonance (i.e., presents infinite shunt impedance) and that the desired value of output-side reactance is achievable via DFT or some other means. It may be further assumed that the input and output filters address harmonics generated by the switching network, possibly including additional filtering not shown.

In some embodiments, a controller within high-bandwidth system can select control variables $X_{comp}$ from $X_{net}$ not only according to the idealized curves of FIG. 7, but also using some combination of feedback and feedforward. This may include the use of digital predistortion, adaptive feedforward, etc., to dynamically determine control points as operating conditions vary.

While the curves of FIG. 7 assume the use of the output filter network to provide variable reactance for matching, in some embodiments, a high-Q input-side tank could likewise be used, the input-side shunt filter susceptance B (imaginary part of admittance Y) can be tuned via DFT in conjunction with switching network operation to achieve impedance matching. In some cases, both input- and output-side susceptances/reactances may be used together to realize matching. There may be benefits to using a higher Q filter network at the output (reducing reactive power handled by the switching network) or at the input (facilitating matching in the multiple output case described below). According to embodiments of the present disclosure, either one or both may be leveraged through DFT or some other means to generate variable reactances (e.g., switched reactance banks, PSIM networks, varactors, mechanically tunable reactances, etc.).

Figures 8A, 8B:
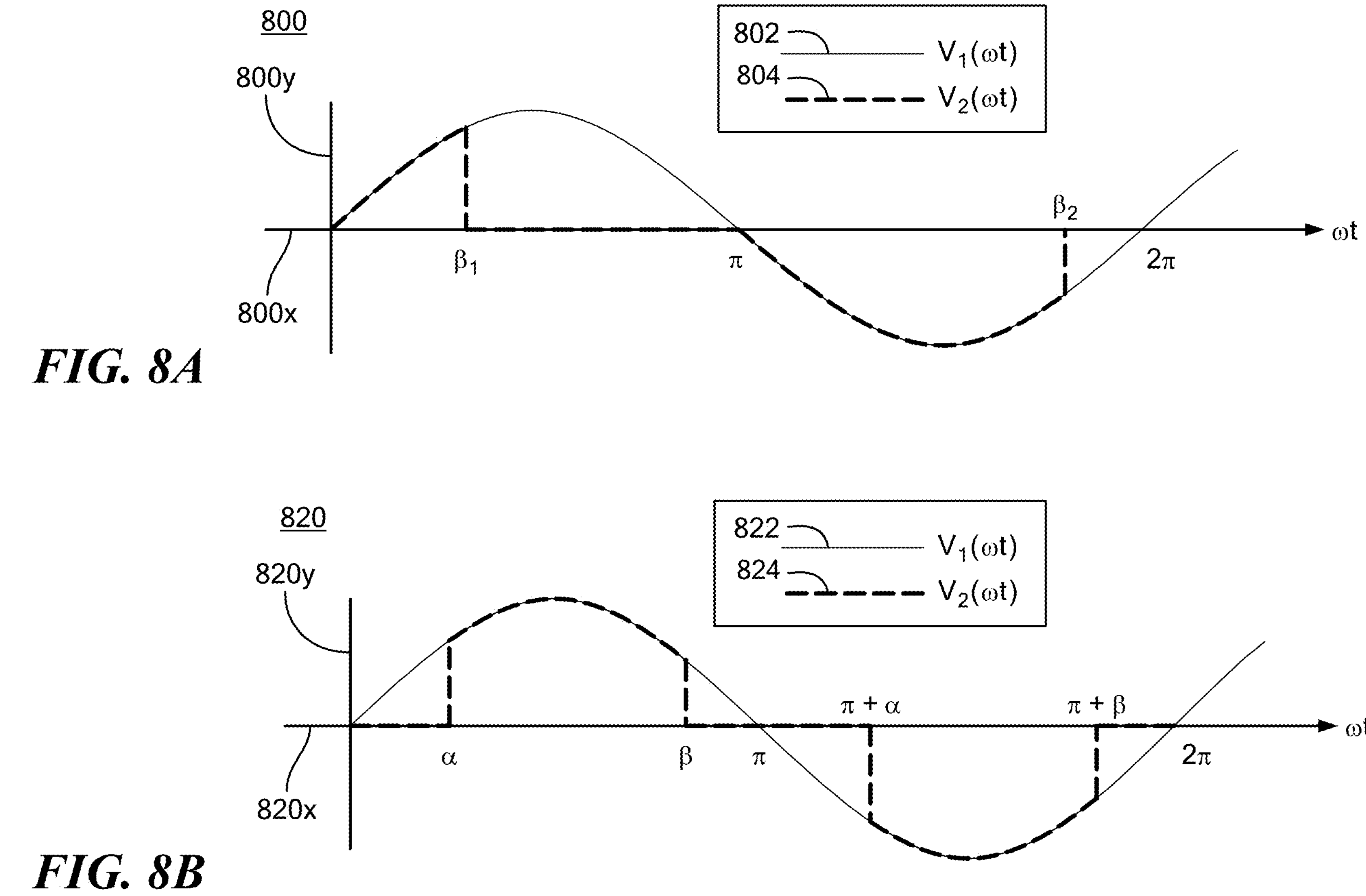
FIGS. 8A and 8B illustrate other switching patterns and associated waveforms that can be used with a CTN circuit, such as that of FIG. 4, 5A, or 5B, according to some embodiments.

FIGS. 8A and 8B illustrate other switching patterns that can be used within CTN-based RF matching systems, architectures, and circuits, such as the RF system of FIG. 2, the CTN architecture of FIG. 3, and/or the CTN circuit implementations of FIGS. 4, 5A, and 5B. These patterns may offer improved control capability in some cases, including the ability to do matching with fixed-frequency operation.

FIG. 8A shows a plot 800 having horizontal axis 800x representing angle (ωt), vertical axis 800y representing voltage, a first waveform 802 represents $V_1$, and a second waveform 804 represents $V_2$ (where $V_1$ and $V_2$ correspond to voltages at different ports of the switching network, as previously discussed). In this example, each half cycle uses different switching angles, $\beta_1$ and $\beta_2$. In more detail, switching transitions can occur at angles θ, $\beta_1$, π, and $\beta_2+\pi$. Again, possible deadtimes between complementary switch pairs may exist. This can allow for controlling both fundamental voltage transformation and—to an extent—phase shift through the switching network. This may be beneficial for added tuning or to enable fixed-frequency operation (e.g., without DFT) over some range.

FIG. 8B shows a plot 820 having horizontal axis 820x representing angle (ωt), vertical axis 820y representing voltage, a first waveform 822 represents $V_1$, and a second waveform 824 represents $V_2$ (where $V_1$ and $V_2$ correspond to voltages at different ports of the switching network, as previously discussed). This example utilizes two switching transitions per half cycle, defined by switching angles, α and β. In more detail, switching transitions can occur at angles α, β, α+π, and β+π. Again, additional deadtimes between complementary switch pairs not indicated may exist as is known in the art. While the additional switching transition provides an additional degree of freedom in controlling phase shift through the switching network, it is appreciated herein that the added transition may be less amenable to ZVS switching. Thus, in some embodiments, additional circuitry may be added to facilitate ZVS switching while using the switching pattern of FIG. 8B. Of note, if one selects switching angle α=π−β, the transformation owing to the switching network will exhibit no phase shift, acting like an "ideal transformer" for fundamental components. Alternatively, switching angles α and β can be selected together to control both transformation ratio and phase shift to provide impedance matching at fixed frequency.

Figure 9:
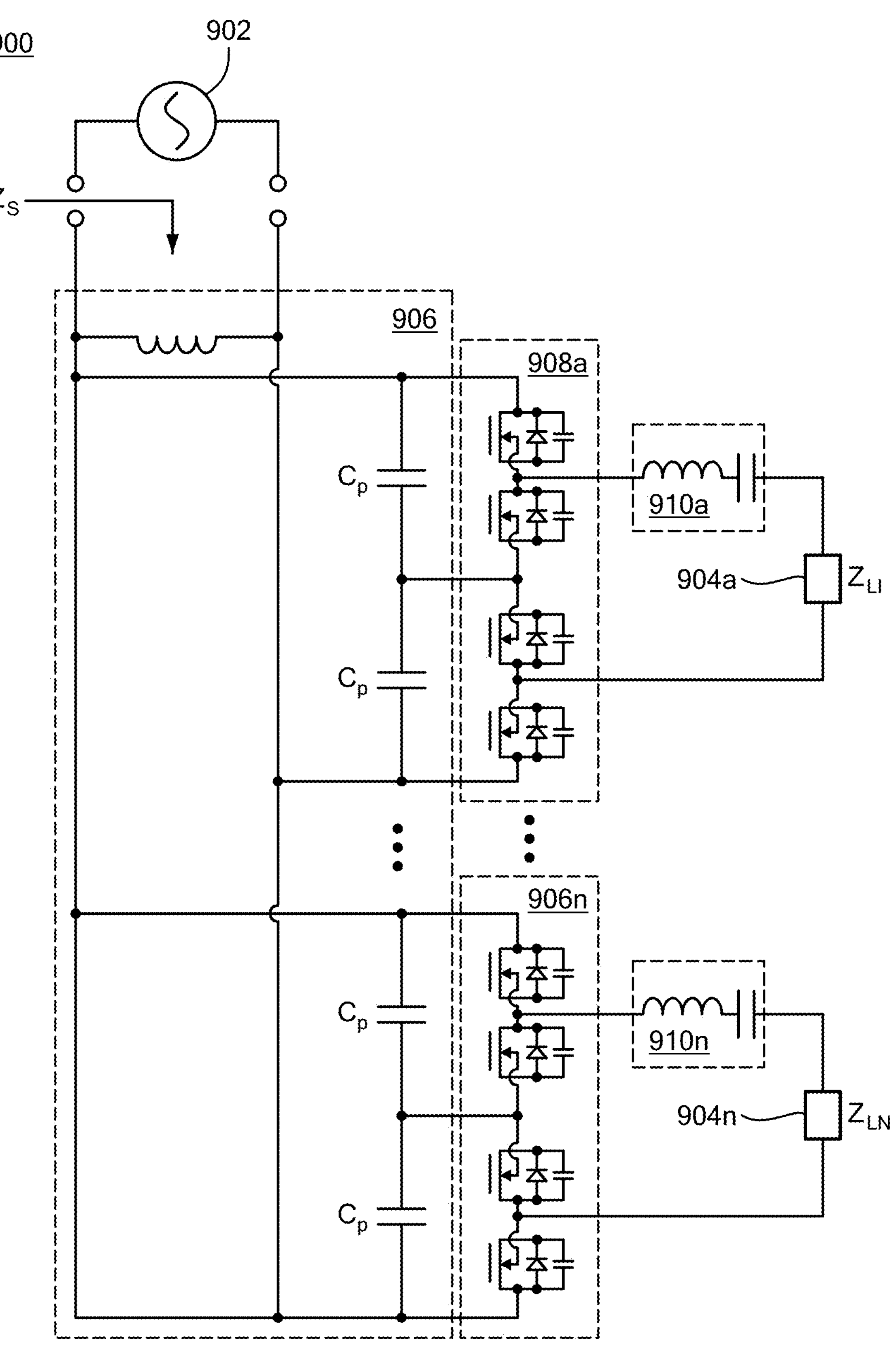
FIG. 9 is circuit diagram showing a multiple-output CTN, according to some embodiments.

Turning to FIG. 9, the structure and techniques disclosed above can be extended to implement a CTN-based impedance matching system that handle multiple outputs (e.g., N=2, 3, 5, etc. outputs). As shown, a multiple-output CTN circuit 900 can match a source 902 to N loads 904a-n. The illustrative circuit 900 includes an input-side filter 906 (e.g., a fundamental voltage selecting filter), N switching networks 908a-n, and N output-side filters 910a-n (e.g., fundamental current selecting filters).

Figure 10:
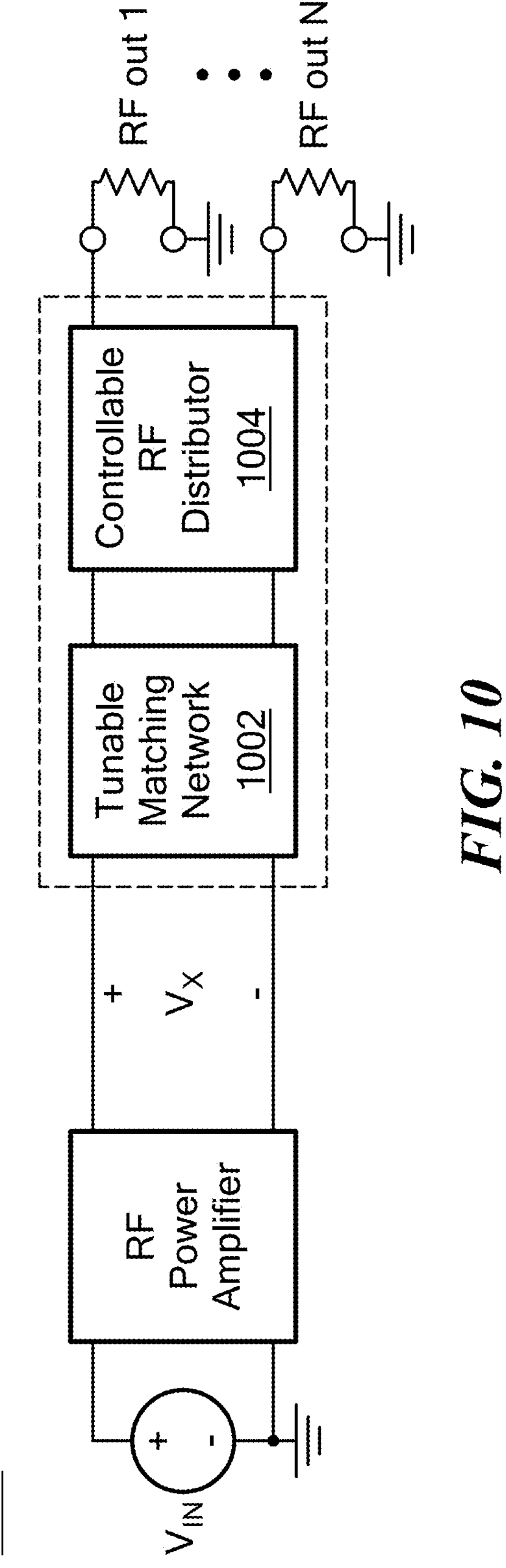
FIG. 10 is a block diagram of a multiple-output RF power delivery system with combined matching and RF power distribution, according to some embodiments.

To control the system of FIG. 9, DFT can be used to provide one tuning handle (e.g., using a high-Q input-side filter network and low-Q output-side filters close to resonance). Each switching network can have an independent control angle β (or set of control angles, such as shown in FIG. 8.) Together these can enable a set of load impedances to provide a desired input port impedance $Z_S$ to the source while enabling control of how power is distributed among the multiple load impedances ZLI to ZLN. This thus represents the combination of a high-bandwidth tunable matching network and a controllable RF power distributor as illustrated for the RF power delivery system 1000 of FIG. 10.

Controllable Transformation Power Amplifiers

Figure 11:
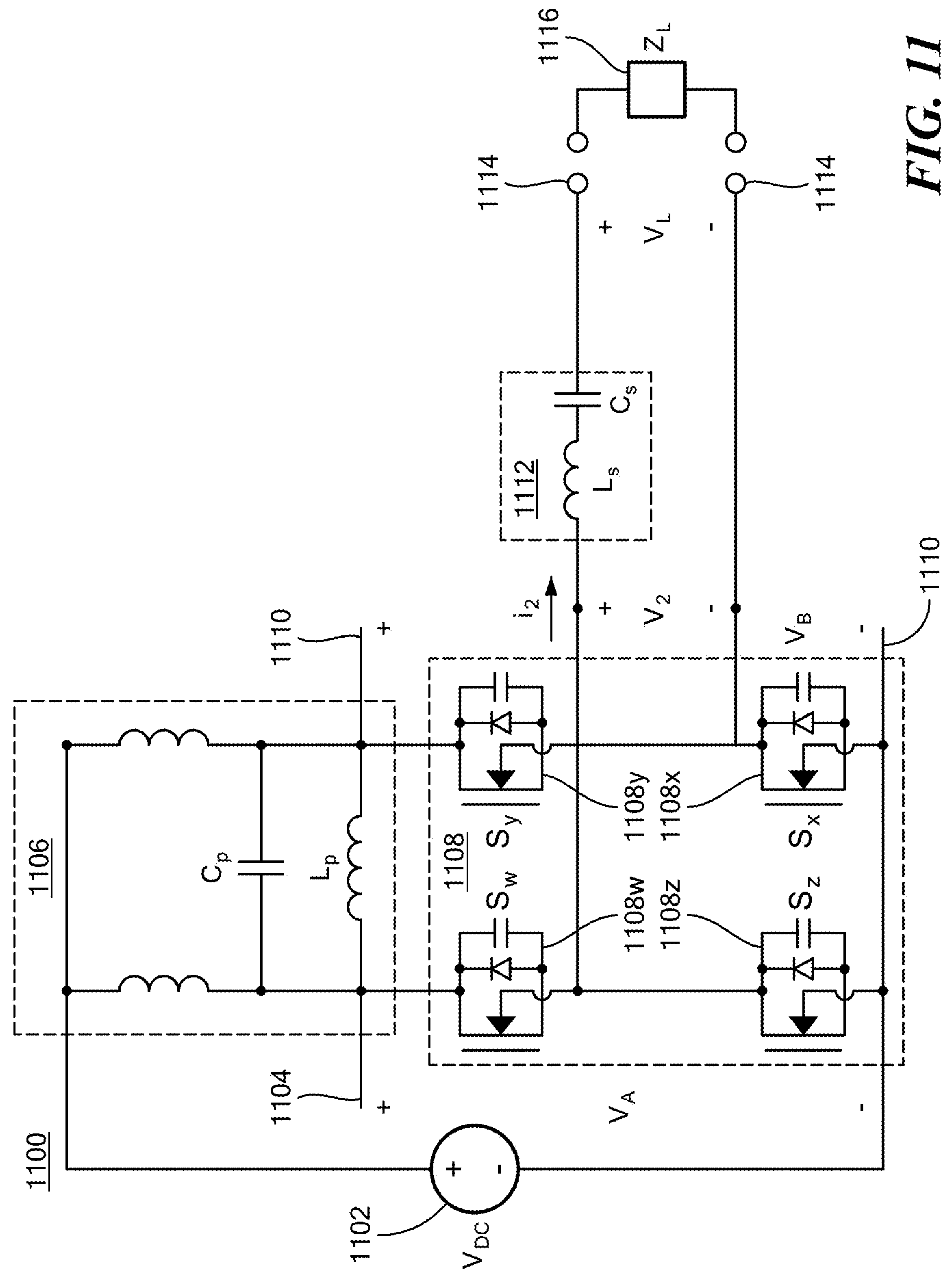
FIG. 11 is a circuit diagram of a controllable transformation power amplifier (CTPA), according to some embodiments.

Turning to FIG. 11, as described above, there is a need for RF inverters (or power amplifiers or RF generators) that can achieve generation and controlled delivery of RF power into highly-variable load impedances with high bandwidth. According to some embodiments, the switching networks, CTNs, and related techniques described above can be leveraged to directly realize power amplifier systems with these characteristics. One approach is to cascade a conventional (e.g., switched-mode) RF amplifier with a CTN. Another is to realize a controllable transformation power amplifier (CTPA).

FIG. 11 shows an example of a CTPA, according to some embodiments. Illustrative CTPA 1100 includes a voltage source 1102, an input port 1104, an input-side filter 1106, a switching network 1108 having four switches 1108w-z, an output port 1110, an output-side filter 1112, and another port 1114 that can be connected to a load 1116, as shown. CTPA 1100 can be operated in a manner that is similar at the input side to an "inverse class D" or "current-mode class D" switching power amplifier, but with the switching angles of the embedded switching network 1108 controlled to achieve controllable voltage transformation (and thereby power control).

Figure 11A:
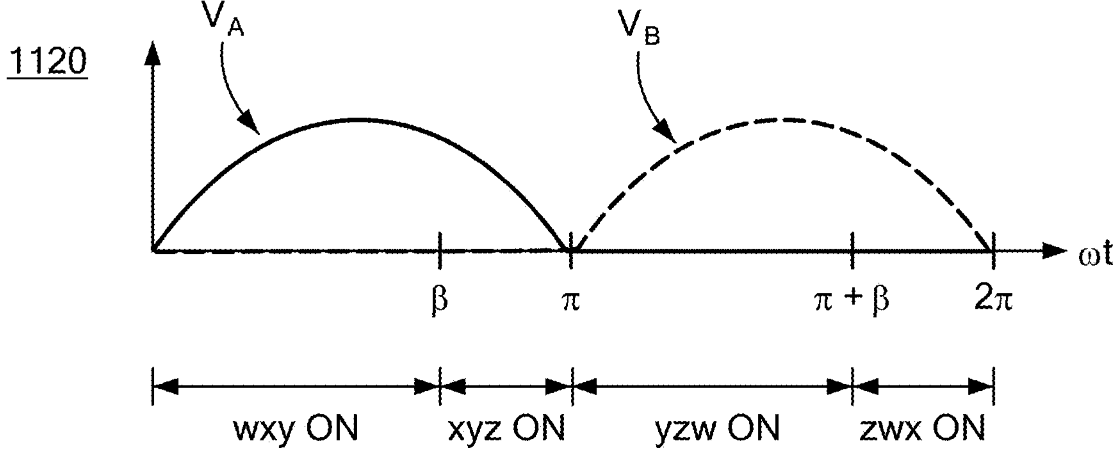
FIG. 11A shows illustrative switching patterns that may be used with the CTPA of FIG. 11, according to some embodiments.
Figure 11A:
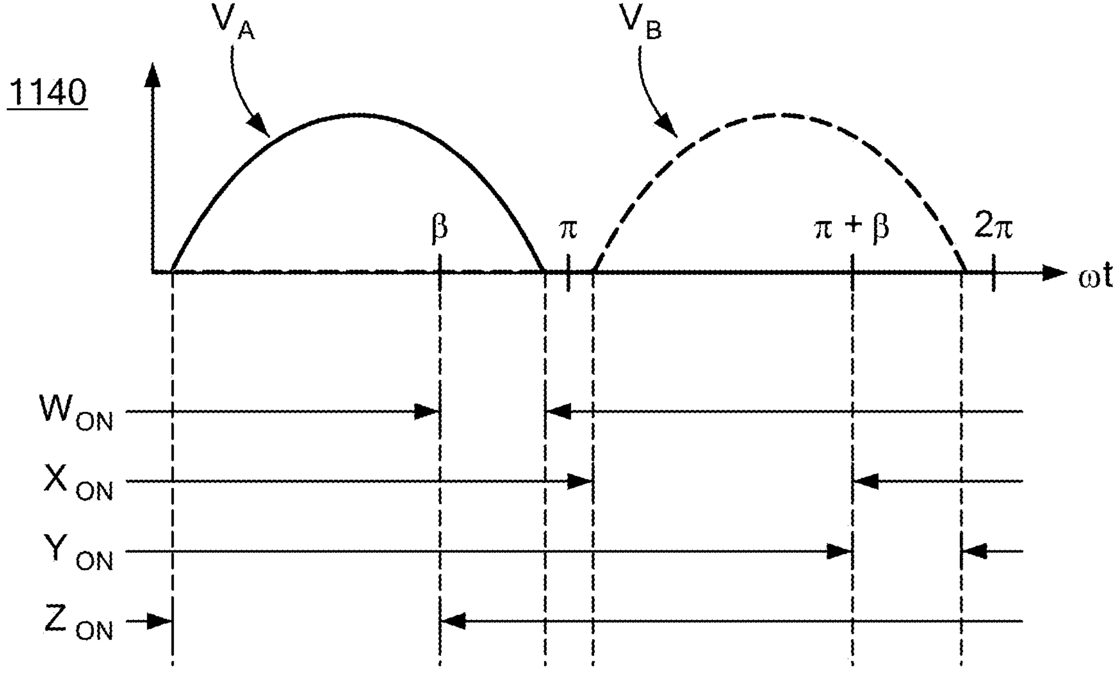

FIG. 11A shows examples of switching patterns and associated waveforms 1120 and 1140 that can be used with the CTPA of FIG. 11.

According to switching pattern and associated waveforms 1120, between angles θ and β, switches 1108$w,x,y$ are on and switch 1108$z$ is off; between angles β and T, switches 1108$x,y,z$ are on and switch 1108$w$ is off; between angles π and π+β, switches 1108$y,z,w$ are on and switch 1108$x$ is off; and between angles π+β and 21, switches 1108$z,w,x$ are on and switch 1108$y$ is off.

According to switching pattern and associated waveforms 1140, between angles θ (approximate) and β, all switches except switch 1108$z$ are on; between angles β and π (approximate), all switches except 1108$w$ are on; between angles π (approximate) and π+β, all switches except switch 1108$x$ are on; and between angles π+β and 2π (approximate), all switches except 1108$y$ are on.

Overlap in the switching waveforms as illustrated in FIG. 11A may be used to maintain ZVS switching of all devices with a high-Q input-side resonance while allowing for variations in switching frequency, such as to enable the use of DFT while providing ZVS switching of the devices. (The control range may be best for switching frequencies at and below the input-side resonant frequency.) DFT of the switching frequency with a high-Q output network enables management of variations in load reactance.

The circuit of FIG. 11 and corresponding switching patterns of FIG. 11A can provide a power amplifier that can handle fast power control into wide-range, rapidly varying load impedances. Control of switching angle β and switching frequency $f_{sw}$ provides the necessary control handles for wide load reactance and resistance ranges. It should also be appreciated that one could realize multiple-output versions of the proposed power amplifier system, for example using an approach similar to that of FIG. 9.

Figure 12:
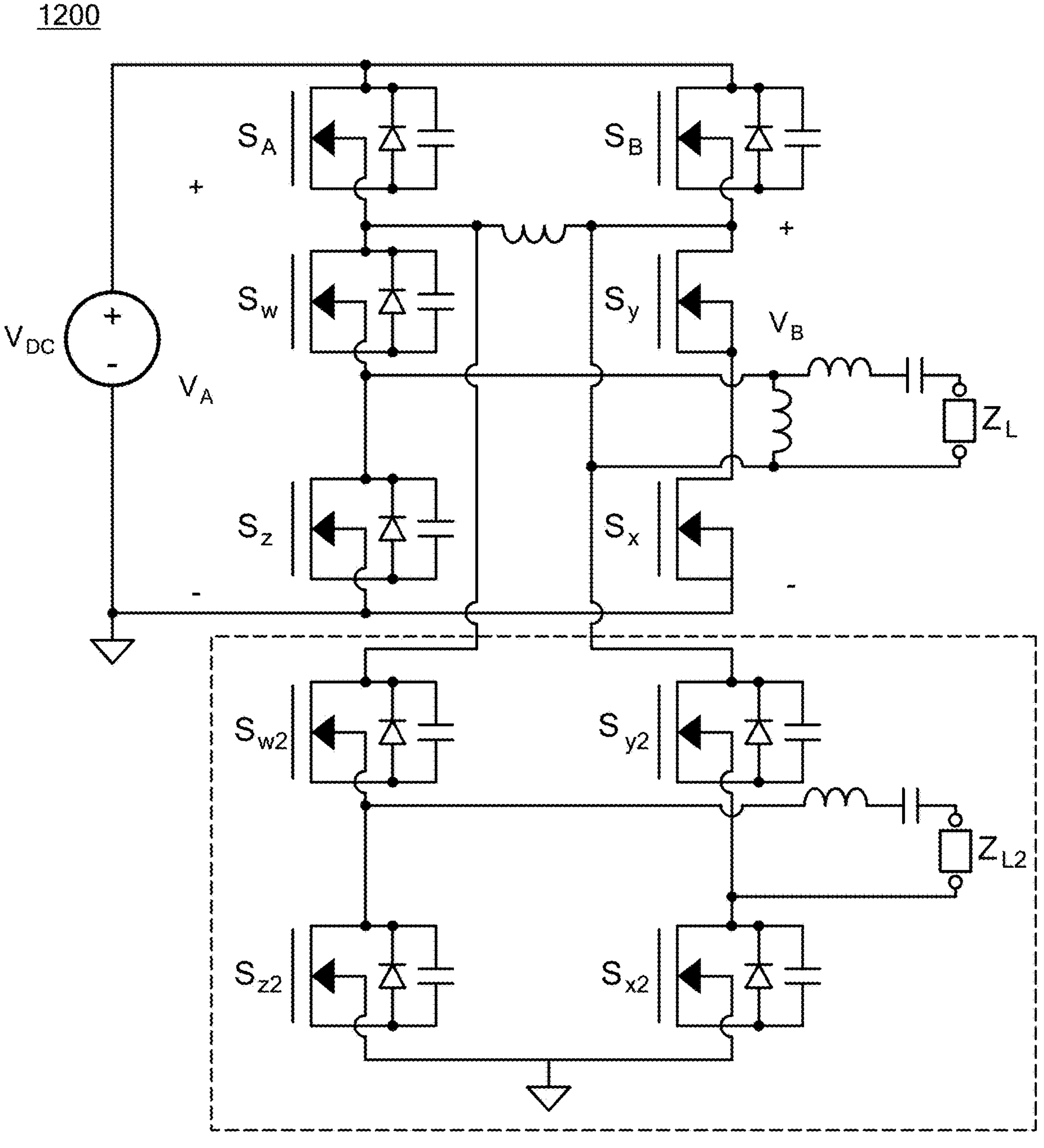
FIG. 12 is a circuit diagram of another CTPA, according to some embodiments.
Figure 12A:
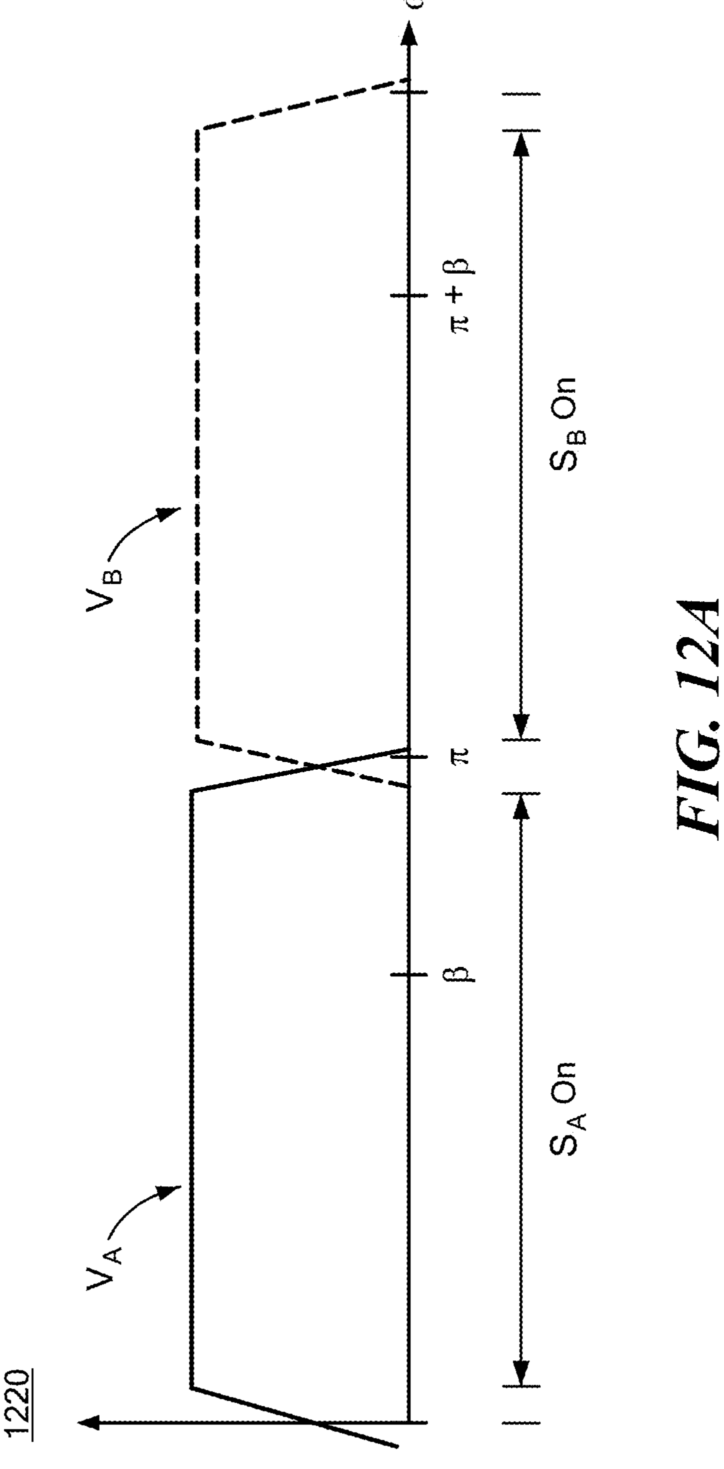
FIG. 12A shows illustrative switching patterns that may be used with the CTPA of FIG. 12, according to some embodiments.

It will be further appreciated other power amplifier topologies may be merged with such switching networks/controllable transformation networks and their associated controls. For example, FIG. 12 shows a realized circuit 1200 based on a voltage-mode class D arrangement, including the option to provide multiple outputs. FIG. 12A shows a switching pattern 1220 that can be used with the circuit of FIG. 12.

As used herein, the terms "processor" and "controller" are used to describe electronic circuitry that performs a function, an operation, or a sequence of operations. The function, operation, or sequence of operations can be hard coded into the electronic circuit or soft coded by way of instructions held in a memory device. The function, operation, or sequence of operations can be performed using digital values or using analog signals. In some embodiments, the processor or controller can be embodied in an application specific integrated circuit (ASIC), which can be an analog ASIC or a digital ASIC, in a microprocessor with associated program memory and/or in a discrete electronic circuit, which can be analog or digital. A processor or controller can contain internal processors or modules that perform portions of the function, operation, or sequence of operations. Similarly, a module can contain internal processors or internal modules that perform portions of the function, operation, or sequence of operations of the module.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures but should be understood.

In the foregoing detailed description, various features are grouped together in one or more individual embodiments for the purpose of streamlining the disclosure. This method of disclosure is not to be interpreted as reflecting an intention that each claim requires more features than are expressly recited therein. Rather, inventive aspects may lie in less than all features of each disclosed embodiment.

References in the disclosure to "one embodiment," "an embodiment," "some embodiments," or variants of such phrases indicate that the embodiment(s) described can include a particular feature, structure, or characteristic, but every embodiment can include the particular feature, structure, or characteristic. Moreover, such phrases are not necessarily referring to the same embodiment(s). Further, when a particular feature, structure, or characteristic is described in connection knowledge of one skilled in the art to affect such feature, structure, or characteristic in connection with other embodiments whether or not explicitly described.

The disclosed subject matter is not limited in its application to the details of construction and to the arrangements of the components set forth in the following description or illustrated in the drawings. The disclosed subject matter is capable of other embodiments and of being practiced and carried out in various ways. As such, those skilled in the art will appreciate that the conception, upon which this disclosure is based, may readily be utilized as a basis for the designing of other structures, methods, and systems for carrying out the several purposes of the disclosed subject matter. Therefore, the claims should be regarded as including such equivalent constructions insofar as they do not depart from the spirit and scope of the disclosed subject matter.

Although the disclosed subject matter has been described and illustrated in the foregoing exemplary embodiments, it is understood that the present disclosure has been made only by way of example, and that numerous changes in the details of implementation of the disclosed subject matter may be made without departing from the spirit and scope of the disclosed subject matter.

All publications and references cited herein are expressly incorporated herein by reference in their entirety.

The invention claimed is:

1. A system for transforming a radio frequency (RF) signal between a source and a load, the system comprising:

a first port and a second port connected to different ones of the source and the load;

a first filter connected to the first port;

a second filter connected to the second port, at least one of the first and second filters operable to provide variable reactance using dynamic frequency tuning (DFT);

a switching network having two ports connected between one port of the first filter and one port of the second filter, the switching network comprising a plurality of switches, wherein the plurality of switches of the switching network comprises four switches arranged in a bridge; and a controller coupled to the switching network and to the source, the controller configured to operate the plurality of switches according to a switching pattern and to dynamically adjust a frequency of the RF signal to provide controllable impedance matching between the first port and the second port.

2. The system of claim 1, wherein the first filter is configured to extract a fundamental voltage of the RF signal.

3. The system of claim 2, wherein the first filter includes a capacitor and an inductor connected in parallel across terminals of the first port.

4. The system of claim 1, wherein the second filter is configured to extract a fundamental current of the RF signal.

5. The system of claim 4, wherein the second filter includes a capacitor and an inductor connected in series with one terminal of the second port.

6. The system of claim 1, wherein the controller operates the plurality of switches synchronously with the RF signal and with a controllable phase shift with respect to the RF signal.

7. The system of claim 1, wherein the controller operates the plurality of switches according to a switching pattern defined by an angle β with respect to the RF signal.

8. The system of claim 7, wherein the controller is configured to calculate β in terms of load resistance $R_L$ and reactance $X_L$.

9. The system of claim 7, wherein the controller is configured to select switching frequency in terms of load resistance $R_L$ and reactance $X_L$.

10. The system of claim 1, wherein the load includes a plasma load.

11. The system of claim 1, wherein the controller is configured to provide controllable impedance matching between the first port and the second port during power steps over at least a factor of two that occur in 10 μs or less.

12. The system of claim 1, wherein the four switches comprise:

a first switch having a first terminal connected to a first terminal of the first filter and having a second terminal connected to a first terminal of the second filter;

a second switch having a first terminal connected to a second terminal of the first filter and having a second terminal connected to a second terminal of the second filter;

a third switch having a first terminal connected to the second terminal of the first switch and to the first terminal of the second filter; and a fourth switch having a first terminal connected to the second terminal of the second switch and to the second terminal of the second filter, and having a second terminal connected to a second terminal of the third switch.

13. The system of claim 1, wherein the four switches comprise:

a first switch having a first terminal connected to a first terminal of the first filter and having a second terminal connected to a first terminal of the second filter;

a second switch having a first terminal connected to the first terminal of the second filter and to the second terminal of the first switch, and having a second terminal connected to a second terminal of the first filter;

a third switch having a first terminal connected to the second terminal of the first filter and to the second terminal of the second switch, and having a second terminal connected to a second terminal of the second filter; and a fourth switch having a first terminal connected to the second terminal of the second filter and to the second terminal of the third switch, and having a second terminal connected to a third terminal of the first filter.

14. The system of claim 1, wherein the four switches comprise unidirectional blocking, bidirectional carrying switches.

15. A controllable transformation network for transforming a radio frequency (RF) signal between a source and a load, the controllable transformation network comprising:

a first port and a second port connected to different ones of the source and the load;

a first filter connected to the first port and configured to extract a fundamental voltage of the RF signal;

a second filter connected to the second port and configured to extract a fundamental current of the RF signal, at least one of the first and second filters operable to provide variable reactance using dynamic frequency tuning (DFT); and a switching network connected between the first filter and the second filter, the switching network comprising a bridge circuit with four switches.

16. The controllable transformation network of claim 15, wherein the first filter includes a capacitor and an inductor connected in parallel across terminals of the first port.

17. The controllable transformation network of claim 15, wherein the second filter includes a capacitor and an inductor connected in series with one terminal of the second port.

18. The controllable transformation network of claim 15, wherein the four switches comprise:

a first switch having a first terminal connected to a first terminal of the first filter and having a second terminal connected to a first terminal of the second filter;

a second switch having a first terminal connected to a second terminal of the first filter and having a second terminal connected to a second terminal of the second filter;

a third switch having a first terminal connected to the second terminal of the first switch and to the first terminal of the second filter; and a fourth switch having a first terminal connected to the second terminal of the second switch and to the second terminal of the second filter, and having a second terminal connected to a second terminal of the third switch.

19. The controllable transformation network of claim 15, wherein the four switches comprise:

a first switch having a first terminal connected to a first terminal of the first filter and having a second terminal connected to a first terminal of the second filter;

a second switch having a first terminal connected to the first terminal of the second filter and to the second terminal of the first switch, and having a second terminal connected to a second terminal of the first filter;

a third switch having a first terminal connected to the second terminal of the first filter and to the second terminal of the second switch, and having a second terminal connected to a second terminal of the second filter; and a fourth switch having a first terminal connected to the second terminal of the second filter and to the second terminal of the third switch, and having a second terminal connected to a third terminal of the first filter.

* * * * *